United States Patent [19]
Paluch

[11] Patent Number: 5,987,574
[45] Date of Patent: Nov. 16, 1999

[54] BANK ARBITRATION FOR SDRAM MEMORY CONTROL

[75] Inventor: Edward J. Paluch, Santa Clara, Calif.

[73] Assignees: Sony Corporation, Tokyo, Japan; Sony Electronics Inc., Park Riedge, N.J.

[21] Appl. No.: 08/846,941

[22] Filed: Apr. 30, 1997

[51] Int. Cl.⁶ .................................................. G06F 12/06
[52] U.S. Cl. ........................................ 711/158; 711/157
[58] Field of Search ............................... 711/5, 105, 154, 711/157, 158; 395/297; 710/117

[56] References Cited

U.S. PATENT DOCUMENTS

| | | | |
|---|---|---|---|
| 5,577,236 | 11/1996 | Johnson | 711/5 |
| 5,659,782 | 8/1997 | Senter | 395/800.23 |
| 5,784,582 | 6/1998 | Hughes | 395/297 |
| 5,787,457 | 7/1998 | Miller | 711/105 |
| 5,802,581 | 9/1998 | Nelsen | 711/157 |
| 5,802,588 | 9/1998 | Ramagopal | 711/156 |
| 5,893,136 | 4/1999 | Stolt et al. | 711/105 |

Primary Examiner—John W. Cabeca
Assistant Examiner—Christopher S. Chow
Attorney, Agent, or Firm—Wood,Herron&Evans, L.L.P.

[57] ABSTRACT

A memory controller for a special purpose digital video processor. To achieve a speed enhancement when using multiple bank memory such as SDRAM, the memory controller arbitrates requests for access to the memory such that, if possible, sequential memory accesses are directed to alternating memory banks. To facilitate access to contiguous blocks of memory such as are often accessed in video signal processing, the memory controller includes an address generator for generating multiple memory addresses in response to a single memory access request. The memory controller further includes features which permit the use of multiple physical memory configurations. Specifically, the memory controller includes a memory address mapper for translating virtual memory address signals into physical memory address signals for addressing memory; for different memory configurations, the translation is different. To further optimize the use of different memory chips, an asynchronous clock is used by the memory relative to the clock of the special purpose processor. Data passing to or from the memory is synchronized to the memory or processor clock by a special purpose data buffer/synchronizer. Also, the memory controller includes a programmable memory interface for generating column address strobe and row address strobe signals in accordance with the timing specifications of the specific memory configuration in use.

8 Claims, 15 Drawing Sheets

| | | | | |
|---|---|---|---|---|
| 0x000000 | 0x000004 | 0x000080 | 0x000084 | 0x000100 | 0x000104 |
| 0x000008 | 0x00000C | 0x000088 | 0x00008C | 0x000108 | 0x00010C |
| 0x000010 | 0x000014 | 0x000090 | 0x000094 | 0x000110 | 0x000114 |
| 0x000018 | 0x00001C | 0x000098 | 0x00009C | 0x000118 | 0x00011C |
| 0x000020 | 0x000024 | 0x0000A0 | 0x0000A4 | 0x000120 | 0x000124 |
| 0x000028 | 0x00002C | 0x0000A8 | 0x0000AC | 0x000128 | 0x00012C |
| 0x000030 | 0x000034 | 0x0000B0 | 0x0000B4 | 0x000130 | 0x000134 |
| 0x000038 | 0x00003C | 0x0000B8 | 0x0000BC | 0x000138 | 0x00013C |
| 0x000040 | 0x000044 | 0x0000C0 | 0x0000C4 | 0x000140 | 0x000144 |
| 0x000048 | 0x00004C | 0x0000C8 | 0x0000CC | 0x000148 | 0x00014C |
| 0x000050 | 0x000054 | 0x0000D0 | 0x0000D4 | 0x000150 | 0x000154 |
| 0x000058 | 0x00005C | 0x0000D8 | 0x0000DC | 0x000158 | 0x00015C |
| 0x000060 | 0x000064 | 0x0000E0 | 0x0000E4 | 0x000160 | 0x000164 |
| 0x000068 | 0x00006C | 0x0000E8 | 0x0000EC | 0x000168 | 0x00016C |
| 0x000070 | 0x000074 | 0x0000F0 | 0x0000F4 | 0x000170 | 0x000174 |
| 0x000078 | 0x00007C | 0x0000F8 | 0x0000FC | 0x000178 | 0x00017C |

FIG. 3C

BANK ARBITRATION FOR SDRAM MEMORY CONTROL

FIELD OF THE INVENTION

The present invention relates to a memory controller for controlling and interfacing digital memory used in digital video processing.

BACKGROUND OF THE INVENTION

Techniques for digital transmission of video promise increased flexibility, higher resolution, and better fidelity. Recent industry collaborations have brought digital video closer to reality; digital video transmission and storage standards have been generated, and consumer digital video products have begun to appear. The move toward digital video has been encouraged by the commercialization of digital technologies in general, such as personal computers and compact discs, both of which have increased consumer awareness of the possibilities of digital technology.

Personal computers, which have recently become common and inexpensive, contain much of the computing hardware needed to produce digital video, including a microprocessor/coprocessor for performing numeric calculations, input and output connections, and a large digital memory for storing and manipulating image data. Unfortunately, personal computers are not suitable for consumer digital video reception, because the microprocessor in a personal computer is a general purpose processor, and typically cannot perform the calculations needed for digital video fast enough to produce full-motion, high definition video output.

Accordingly, there is a need for a special purpose processor particularly suited for performing digital video-related calculations, which can be used as a digital video receiver in consumer applications. Since costs can be most effectively contained by using standard personal computer components where possible, there is a further need for a special purpose microprocessor which facilitates use of commercially available and inexpensive computer components such as digital memory chips. At the same time, however, the special purpose processor must be sufficiently flexible to use any of the available variety of digital memory chips at or near their maximum speed.

SUMMARY OF THE INVENTION

In accordance with the present invention, the above needs are met by a special purpose processor for performing computations needed for digital video reception, which is equipped with a memory interface facilitating use of standard computer memory components in connection with the special purpose processor, to thus reduce the attendant costs.

The special purpose processor includes a memory controller including features for reducing average access times when the processor is used with a multiple-bank memory such as an SDRAM, in which one bank of memory can be precharged while other bank(s) are read. To achieve a speed enhancement, the memory controller arbitrates requests for access to the memory such that, if possible, sequential memory accesses are directed to alternating memory banks. Specifically, after the memory controller provides access to one of the banks of memory, the memory controller determines, for each pending request for access to the memory, the bank of memory to which the request seeks access, and selects those "other bank" requests requesting access to banks other than the most-recently-accessed bank. If there are one or more other bank requests, the memory controller selects one of the other bank requests and provides access to the memory in response thereto. Only if there are no other bank requests, will the memory controller provide access to the memory in response to requests directed to the most-recently-accessed bank.

In the disclosed specific embodiment, the memory controller also arbitrates between requests by assigning each functional unit of the processor a memory access priority. These memory access priorities are used as a second level for prioritization of memory access requests; specifically, if there is more than one other bank request, the memory controller provides access to the memory in response to the other bank request having the highest memory access priority among all other bank requests. Otherwise, if there are no other bank requests, the memory controller provides access to the most-recently-accessed bank of the memory in response to the request having highest memory access priority.

The memory controller further includes an override capability, which can be activated so that any memory access request from a given functional unit will always be included in the selected group of other bank requests. When the override capability is used, memory access requests from the given functional unit are provided enhanced priority as compared to requests from other functional units.

The above and other aspects, objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

FIG. 3C is a memory map illustrating the arrangement of memory and patterns for memory access facilitated by the address generator of FIG. 3A;

FIG. 4I is a block diagram of the structure of the reordering and multiplexing circuit of FIG. 4A.

DETAILED DESCRIPTION OF SPECIFIC EMBODIMENTS

Figure 1:
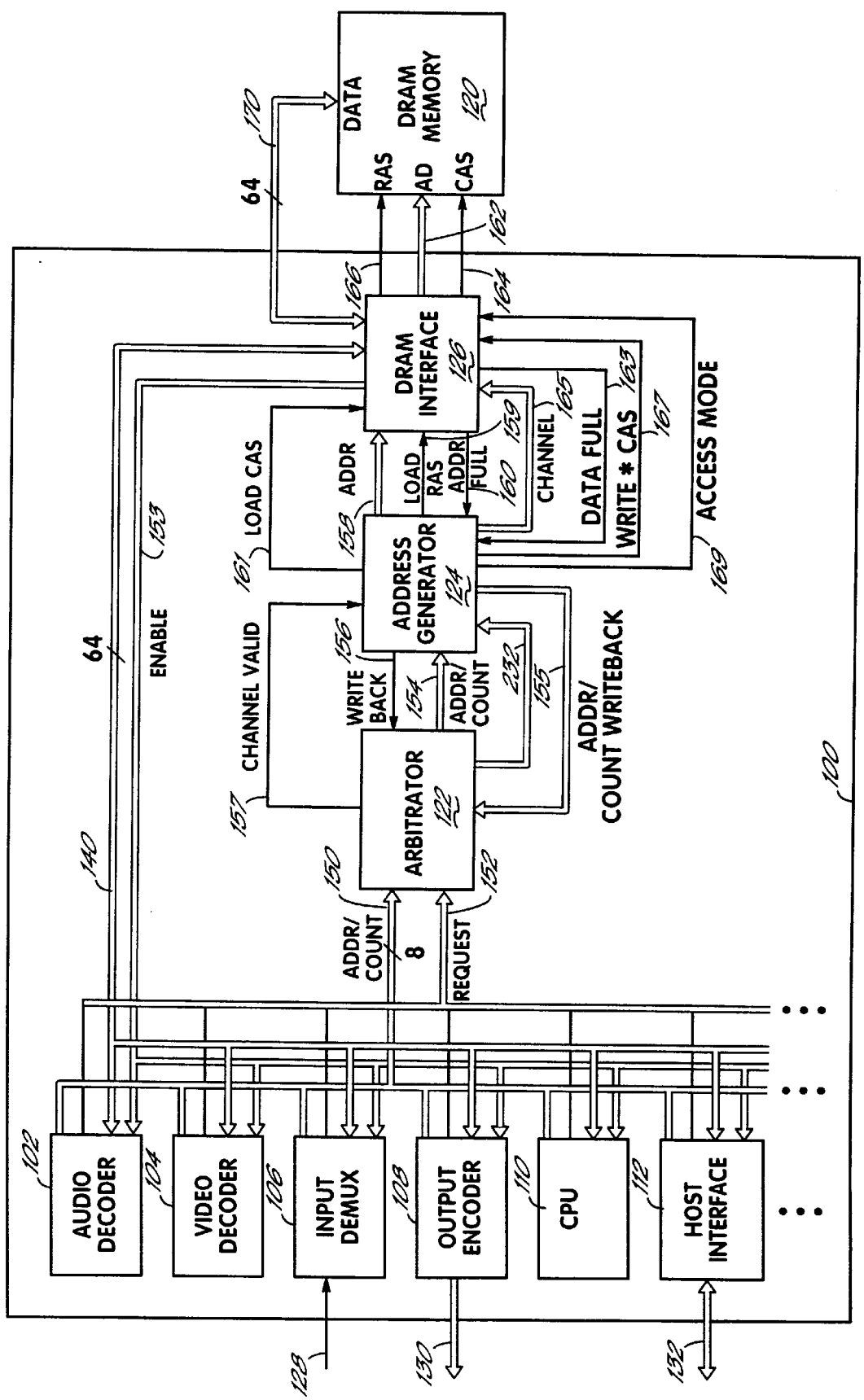
FIG. 1 is a block diagram of an application specific integrated circuit (ASIC) for performing digital video signal decompression and output, illustrating in particular functional blocks of a memory controller in accordance with present invention.

Referring to FIG. 1, in accordance with the principles of the present invention, an application specific integrated circuit (ASIC) 100 incorporates various functional modules 102 through 112 which perform video decoding and audio decoding tasks for the purposes of digital video reception. It will be understood that the functional units illustrated in FIG. 1 are exemplary, and in a practical implementation, additional functional units might be included. For example, in one implementation used with the memory controller discussed herein, there are 20 such functional units. Each of the functional units 102 through 112 interacts in various ways with a large off-chip memory 120, which is a dynamic random access memory or DRAM.

Access to DRAM 120 is controlled by a memory controller on the ASIC 100. This memory controller includes an arbitrator 122 for determining which of the functional units 102 through 112 may access memory 120, an address generator 124 for generating addresses in response to requests for memory access from functional units 102 through 112, and a DRAM interface 126 for generating address and control signals for controlling DRAM 120. The memory controller, in effect, establishes 20 "channels" through which functional units on the ASIC 100 may access memory. Each channel is separately serviced by the memory, under the control of the memory controller.

For exemplary purposes, a few of the functional units of the ASIC 100 which make use of memory 120 will be described. These functional units include an input demultiplexer 106 which receives the digital input signal on line 128, parses this digital input signal into video, audio and other commands, and stores the input signal in DRAM 120 using the memory controller. An audio decoder unit 102 retrieves audio information from DRAM 120, decodes the audio information for output, and delivers the audio information to an output encoder 108 for output on lines 130. A video decoder 104 similarly retrieves video information stored in DRAM 120, decodes the video information (using frequent and repetitive accesses to DRAM memory 120) in accordance with the video encoding scheme in use, and after decoding delivers the video information to output encoder 108.

Control of the application specific integrated circuit 100 is provided by a central processing unit (CPU) 110 which controls and monitors the operation of each of the other functional units on the ASIC 100. Furthermore, the ASIC 100 includes a host interface 112 for interacting with a host computer via lines 132 to permit the host computer to monitor and control operations of the ASIC 100.

As illustrated in FIG. 1, each of the functional units in the ASIC 100 interacts with the memory controller via various data and signal lines. Specifically, each functional unit is connected to a 64 bit data bus 140 through which data may be retrieved and delivered to the DRAM interface 126 of the memory controller, and thus to or from memory 120. Further, each functional unit 102 through 112 delivers virtual address and additional memory access request information through a bus 150, which may be one or more 32-bit busses, used by functional units making frequent memory accesses, or an 8-bit, time multiplexed bus shared by several functional units. Finally, each functional unit 102 through 112 requests service from the memory controller via signals on lines 152 connected to arbitrator 122. The memory controller enables each functional unit 102 through 112 to read or write data to memory in response to a request, using enable lines 153 connected to the DRAM interface 126.

As will be discussed in further detail below, arbitrator 122 and address generator 124 interact to generate a sequence of multiple accesses of memory locations in response to a single request from a functional unit. The number and arrangement of this sequence of memory locations to be accessed, is identified by the 32 bits delivered as a memory access request on bus 150 from the functional unit 102 through 112. Arbitrator 122 stores each request, and when a request is available to be serviced, arbitrator 122 delivers the request to address generator 124 over lines 154, identifies the channel making the request via a signal on lines 232, and informs address generator 124 of the presence of a request by asserting a CHANNEL VALID signal on a line 157. Address generator 124 then reads the request on lines 154 and channel number on line 232, and proceeds to generate the appropriate sequence of memory addresses.

Address generator 124 establishes a maximum number of memory locations that certain channels may access. If a memory access request exceeds the maximum for its associated channel, address generator 124 halts processing of the request and delays further accesses of memory locations until a later time. In such a situation, address generator 124 generates a substitute request indicating the remaining locations to be accessed, and delivers this request to arbitrator 122 via ADDRESS/COUNT WRITE BACK bus 155. At the same time, address generator 124 asserts a WRITE BACK signal on line 156 to arbitrator 122, indicating that a substitute request is being written back to the arbitrator 122. Arbitrator 122 responds to the WRITE BACK signal by storing the substitute request, and selecting a new memory access request for delivery to the address generator 124 (which may be the substitute request written back to the arbitrator, if there are no other requests pending in the arbitrator). A similar write-back procedure may be followed in the event of a page crossing, although in such a case, memory accesses for the channel will in all cases continue on the new page.

As addresses for memory locations to be accessed are generated by address generator 124, the addresses are delivered to DRAM interface 126 over a 24 bit address line 158. Sequences of addresses on address line 158 are then converted by DRAM interface 126 into physical addresses for accessing memory 120. DRAM interface 126 includes an internal buffer for buffering the generated addresses, and an internal buffer for buffering data to be delivered to memory 120. Address generator 124 will deliver addresses to DRAM interface 126 unless and until either buffer becomes full, as indicated by an ADDRESS FULL signal on line 160 and/or a DATA FULL signal on line 163.

As part of generating addresses, address generator 124 determines whether an address delivered to DRAM interface 126 is the first address in a new page, thus will require that a new row address be delivered to memory 120. If a new row address must be delivered to memory 120, address generator 124 delivers a LOAD RAS signal on line 159. Once the row address has been delivered, subsequent accesses in the same memory page only require deliver of column addresses to the memory, and address generator 124 accordingly delivers a LOAD CAS signal on line 161 along with the address on line 158.

To permit DRAM interface to deliver data read from memory 120 to the appropriate functional unit, address generator 124 provides DRAM interface 126 with a CHANNEL signal on lines 165 indicating the channel for which the memory addresses on lines 158 are being generated. If the data is being read from memory at the identified addresses, DRAM interface 126 uses the signals received over lines 165 to enable the appropriate functional unit to receive the data returning from memory 120. If data is being written to memory at the identified addresses, DRAM interface 126 uses the signals received over lines 165 to enable the appropriate functional unit to begin delivering data to DRAM interface 126 over data bus 140. To facilitate the latter process, address generator 124 produces a WRITE*CAS signal on line 167, indicating when a new column address is being delivered to memory 120 for the purpose of writing to memory 120. The WRITE*CAS signal thus indicates when a functional unit should be activated to begin delivering data to DRAM interface 126 for writing to memory 120. Furthermore, address generator 124 delivers an ACCESS MODE signal on lines 169 indicating how memory 120 is to be set up to respond to particular addresses, as discussed below.

As will be discussed in further detail below, DRAM interface 126 is configured to permit use of a multitude of different configurations of DRAM memory. DRAM interface 126 includes circuitry for generating an appropriate mapping of virtual addresses received on line 158 into physical row and column addresses for delivery via bus 162 to DRAM memory 120. DRAM interface 126 further generates column address strobe signals on line 164 and row address strobe signals on line 166 to cause DRAM 120 to access memory locations identified by address bits on bus 162. At the same time, data received for storage from 64-bit data bus 140 is delivered to DRAM 120 over a data bus 170, and retrieved data received from data bus 170 is delivered to 64 bit data bus 140. (As will be discussed in further detail below, data bus 170 includes 64 data lines, but in various memory applications, not all of these lines are used. Specifically, in some memory applications, the memory 120 is 32-bits wide and only the 32 least significant lines of bus 170 are used. In other memory applications, the memory 120 is only 16-bits wide and only the 16 least significant lines of bus 170 are used.)

DRAM interface 126 includes circuitry for appropriately remapping data and addresses onto buses 162 and 170 to allow use of a 64, 32, or 16 bit wide DRAM 120, depending upon the application, as is discussed in further detail below in connection with FIGS. 4E–4I. DRAM interface 126 further includes circuitry for producing column address strobe and row address strobe signals on lines 164 and 166 which are timed appropriately to optimize use of the DRAM 120. These and other features of DRAM interface 126 will be explored in substantially greater detail below.

Figure 2:
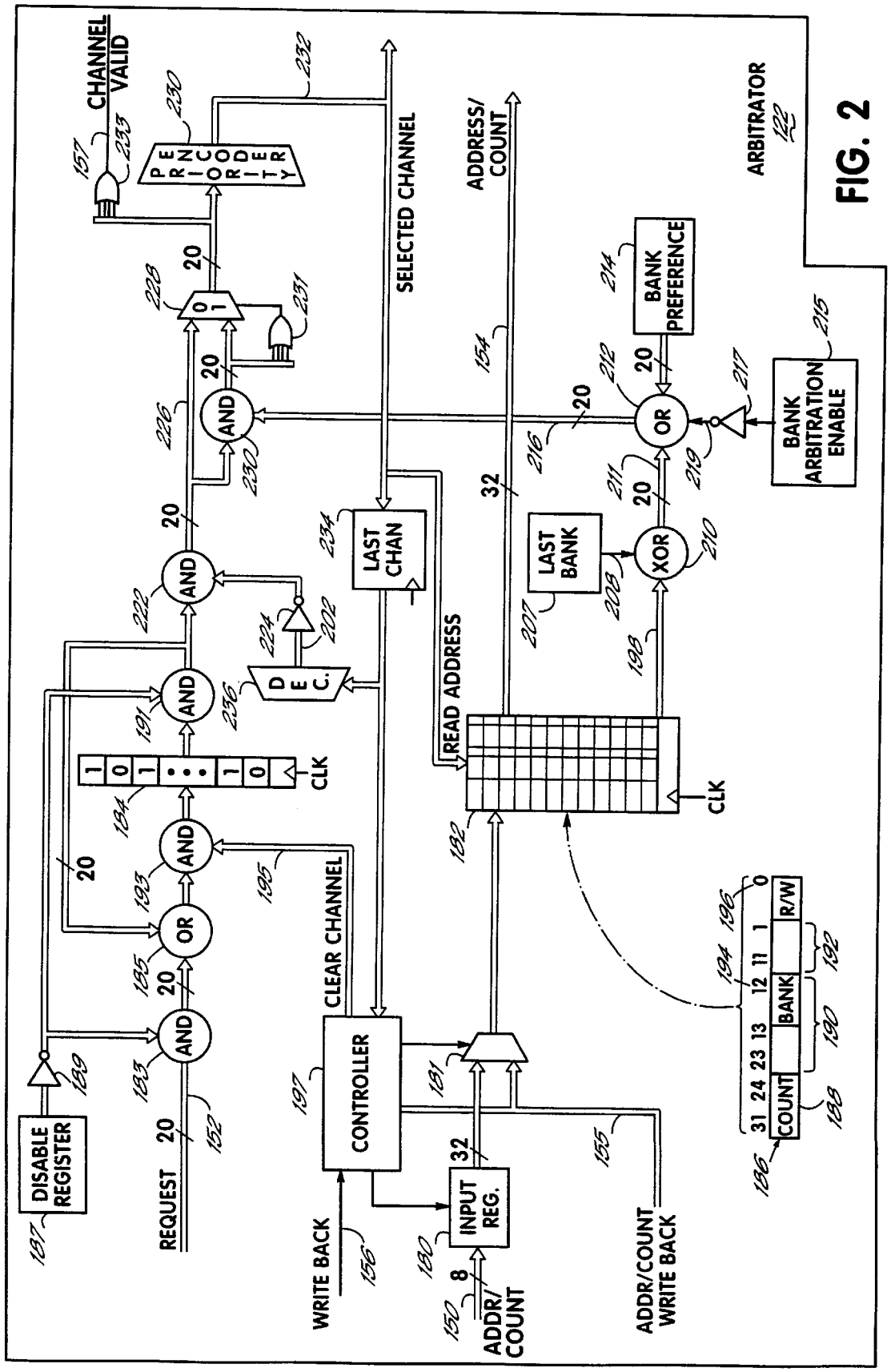
FIG. 2 is a block diagram of the arbitrator of the memory controller of FIG. 1, configured for arbitrating between memory requests based on the requesting functional unit as well as the memory bank to which the request is directed.

Referring now to FIG. 2, the details of arbitrator 122 can be discussed. As noted above, one input to arbitrator 122 is an 8 bit, time multiplexed bus 150 through which 32-bit address and count signals are delivered to arbitrator 122 from the various functional units. The 32-bit address/count signals are demultiplexed and stored in a 32-bit wide input register 180, which can be read by elements within the arbitrator 122. (Functional units which make frequent use of memory, might use separate 32-bit busses, not shown, to deliver memory requests to register 180 in a demultiplexed fashion.) Another input to arbitrator 122 is the request lines 152 which connect to each of the functional units. In one particular embodiment of an application specific integrated circuit 100, there are twenty such functional units, and therefore, twenty request lines 152 which lead from each functional unit to arbitrator 122.

When a functional unit desires access to memory locations for reading or writing, the functional unit asserts its respective request line 152. At the same time, the functional unit delivers the associated address and count signals for the requested memory access, via bus 150, to arbitrator 122. (A bus master circuit, not shown, arbitrates access to bus 150.) The address and count signal delivered to arbitrator 122, after being demultiplexed in input register 180, is then delivered through multiplexer 181 into an appropriate one of a set of registers, which can be viewed as a static memory 182. Memory 182 contains twenty registers, one for each functional unit which may request access to memory locations.

When a new memory access request is written to a location in memory 182, the request signal delivered on lines 152 causes a corresponding bit in a group of twenty flip-flops to be set. This group of twenty flip flops can be viewed as a single, 20 bit register 184. The bits in register 184 are set to a one value, if there is a pending memory access request from the corresponding functional unit stored in memory 182. As will be seen in the following discussion, the bits of register 184 are used to choose one of the pending memory access requests for delivery to address generator 124 (FIG. 1) to permit access to the requesting functional unit.

As seen in FIG. 2, the twenty request lines 152 are delivered to the register 184 through a series of logical operations. Specifically, the twenty request lines 152 are delivered to the first input of a 20-bit AND circuit 183. AND circuit 183 forms the logical AND, on a bit-by-bit basis, of 20-bit signals delivered to its two inputs. The second input to AND circuit 183 is derived from a 20-bit disable register 187. Disable register 187 contains 20 bits, each bit corresponding to a one of the functional units of the ASIC. A "1" value in one of the bit locations in disable register 187 indicates that memory access for the corresponding functional unit is disabled. The output of disable register 187 is connected to a 20-bit inverter 189, which produces a 20-bit signal, the individual bits of which are the logical inverse, on a bit-by-bit basis, of the 20-bit signal output by disable register 187. The output of inverter 189 is connected to the second input of the 20-bit AND circuit 183. As a result, the twenty bits output from AND circuit 183 will have a "1" value only if there is a request asserted from the corresponding functional unit on lines 152, and that functional unit is not disabled from memory access by register 187.

The 20-bit output of AND circuit 183 is delivered to a first input of a 20-bit OR circuit 185. The second input of OR circuit 185 is connected to the output of an AND circuit 191, which derives signals from the current contents of register 184. Specifically, the current contents of register 184 are output to the first input of AND circuit 191. The second input of AND circuit 191 is connected to the output of 20-bit inverter circuit 189. Accordingly, the twenty bits output from OR circuit 185 will have a "1" value only if there is a request being asserted on lines 152, or there is a pending request stored in register 184, and accesses are not disabled for the corresponding functional unit.

The 20-bit output of OR circuit 185 is delivered to a first input of a 20-bit AND circuit 193. The second input of AND circuit 193 is connected to a 20-bit CLEAR CHANNEL signal on lines 195, generated by an arbitrator controller 197. The output of AND circuit 193 is delivered to register 184. Register 184 is clocked by the ASIC clock, and accordingly, each clock cycle the bits in register 184 are updated by any new requests delivered on lines 152, or any changes to the disable register 187 or the CLEAR CHANNEL signal on lines 195.

Arbitrator controller 197 uses the CLEAR CHANNEL signal on lines 195 to clear a request from register 184. Specifically, to clear a request bit from register 184, controller 197 delivers a "0" value on one of lines 195. A "0" value on one of lines 195 causes AND circuit 193 to produce a "0" value on the corresponding output line, so that a "0" value is stored in the corresponding location of register 184 on the next clock cycle. As will be seen below, controller 197 clears request bits from register 184 when a request has been satisfied.

The specific format of a memory access request is illustrated in FIG. 2. The memory access request is a 32 bit word 186 comprised of a more significant section 188 of eight bits, which identifies a number of memory locations to be written or read as a result of the access request. Some of the functional units serviced by the memory controller access memory locations in rectangular blocks. For accesses of this kind, the more significant four bits of section 188 identify a number of columns to be accessed (in binary representation), and the less significant four bits of section 188 identify a number of rows to be accessed (in the specific implementation discussed herein, the binary value in these four bits is one larger than twice the number of rows to be accessed). For non-rectangular accesses, the eight bits of section 188 collectively identify a number of sequential memory locations to be accessed.

The access request word 186 further includes a 24 bit base address, which can be further divided into a virtual row address 190 and a virtual column address 192. (From the following discussion it will be understood that the actual number of bits in each row of memory may be different based on the specific memory configuration.) The virtual row and column addresses 190 and 192 indicate the location of the base address for the block of addresses to be accessed by the request. The base address and count identify one or more locations in memory, and are subsequently translated to physical address locations by DRAM interface 126 as discussed in further detail below.

Notably, the least significant bit 194 of the virtual row address 190 may identify a bank number. If the physical memory used with the memory controller is SDRAM, this bank number, 0 or 1, indicates which of two memory banks in the SDRAM are addressed by the row address 190 of the base address. When SDRAM memory is used, the bank address bit 194 of the memory accesses is used to prioritize and arbitrate between memory access requests, as discussed in detail below.

Also notable in the access request format 186, is the least significant bit 196 of the access request, which indicates whether the access request is a request to read the identified memory locations, or write the identified memory locations. The use of this bit to control access to DRAM 120 will be discussed in connection with address generator 124 and DRAM interface 126.

As noted, when DRAM 120 is a SDRAM, the banks of the SDRAM can be identified from the least significant bit 194 of the virtual row address 190 of the memory access request 186. An SDRAM memory achieves improved performance when one bank of the SDRAM is precharged while the opposite bank of the SDRAM memory is read, and vice versa, and the banks are alternately accessed on a regular basis. Accordingly, to achieve performance enhancement when SDRAM is used, it is advantageous to select memory accesses in such a way that the memory accesses alternate between the two banks of the SDRAM. Accordingly, the arbitrator 122 illustrated in FIG. 2 includes circuitry for determining which bank each memory access request in memory 182 seeks to address, and the circuitry endeavors to alternate accesses between the banks of DRAM 120 when SDRAM memory is in use.

To perform this sort of bank-based arbitration, the least significant bits 194 of the virtual row addresses identified in memory 182 are collected and output on a 20 bit bus 198. The twenty digital signals on bus 198 identify which of the two banks of SDRAM memory are addressed by the twenty memory access requests in memory 182. These twenty signals are delivered to a first input of an exclusive OR circuit 210. The second input of exclusive OR circuit 210 receives a single bit from a flip-flop 207. The bit in flip-flop 207 identifies the bank of memory addressed by the most recent memory access performed by arbitrator 122. Flip-flop 207 is written with the bank number when a LOAD RAS signal is asserted to the DRAM interface on line 159, indicating that a new row address is being loaded into memory 120. (DRAM interface 126 includes circuitry, not shown, for writing the appropriate single bit into flip-flop 207.) Exclusive OR circuit 210 produces a twenty bit output signal on bus 211 which is the result of the exclusive OR of the signal on line 208 and each respective one of the signals on bus 198. Because the signal on line 208 indicates the bank of SDRAM addressed by the preceding memory access, each of the twenty signals on bus 211 will include a "1" value only if the bank addressed by the corresponding memory access request in memory 182 is addressing the opposite bank to the bank addressed by the immediately most preceding memory access. Accordingly, the signals on line 211 identify which of the twenty memory access requests in memory 182 are directed to the bank opposite to the most recently addressed bank in SDRAM memory 120.

The twenty bit signal on bus 211 is input to an OR circuit 212. The second input to OR circuit 212 is a twenty bit signal obtained from a bank arbitration override register 214. The third input to OR circuit 212 is a one bit signal on line 219. The output of OR gate 212 is a twenty bit signal on bus 216, where each bit delivered to bus 216 is the logical OR of the signal on line 219, and respective single signals from lines 211 and the output of bank preference register 214.

Bank arbitration override register 214 is a twenty bit register which can be accessed by the CPU 110 of the ASIC 100 (FIG. 1). If one of the twenty bits in bank arbitration override register 214 is set to a one value, this will cause the corresponding bit on bus 216 to be forced to a one value, regardless of whether the corresponding bit on bus 211 has a one value. As discussed above, when a bit on bus 211 has a one value, this indicates that the memory access request for the corresponding location in memory 182 is addressing the opposite of the most-recently-accessed bank (a request addressing the opposite of the most-recently-accessed bank may hereafter be referred to as an "other bank request", and a request addressing the most-recently-accessed bank may be referred to as a "same bank request"). As detailed below, other bank requests will be given higher priority than same bank requests. In some circumstances, it may be desirable to override this preference for other bank requests. Accordingly, by setting one of the twenty bits in bank arbitration override register 214, a "1" value can be produced on bus 216 in the corresponding location, regardless of whether the corresponding request is an other or same bank request. Thus, by setting values in bank arbitration override register 214, it is possible to determine whether any, some or all of the functional units which access DRAM memory will or will not participate in bank-based arbitration.

The signal on line 219 is derived from a single bit stored in a bank arbitration enable flip-flop 215. If the output of flip-flop 215 is set to a "0" value, this disables bank arbitration for any and all channels. The output of flip-flop 215 is delivered to an inverter 217, and the output of inverter 217 on line 219 is delivered to OR circuit 212, so that a "0" output from the bank arbitration flip-flop 215 will force a "1" value on all of the lines 216.

As will be noted below, the application specific integrated circuit 100 may or may not be used with SDRAM memory. In case the ASIC 100 is not used with SDRAM memory, the bank arbitration enable flip-flop 215 is written to a "0" value, which effectively disables bank arbitration. Furthermore, if a particular functional unit has a sufficiently high priority, that it should not be required to participate in bank arbitration, the corresponding bit in the bank arbitration override register 214 may be written to a "1" value to override bank arbitration for that functional unit.

Through the various logic circuitry discussed above, the twenty digital signals on bus 216 indicate whether the respective memory access requests stored in memory 182 are addressed to the same or the opposite memory bank as that most recently accessed (subject to any overrides as discussed). These signals on bus 216 are combined with signals produced by additional circuitry, discussed below, to select one of the memory access requests in memory 182 for delivery to address generator 124 over bus 154.

As discussed above, the twenty bits in register 184 will have a one value if there is a pending memory access request from the corresponding functional unit (the details of the access request being stored in memory 182). These twenty bits from register 184 are output, via AND circuit 191, to a first input of an AND circuit 222. The second input of AND circuit 222 is obtained from a twenty bit inverter 224 responsive to the signals on bus 202. Bus 202 is a twenty bit bus, including a single "1" value bit identifying the functional unit which was previously granted access to memory 120, and "0" values in the remaining nineteen bit positions. Accordingly, the output of inverter 224 includes nineteen "1" value bits corresponding to the nineteen functional units which were not previously granted access to memory 120, and one "0" value bit in the location corresponding to the functional unit which was previously granted access to memory 120. AND gate 222 produces a twenty bit output signal on bus 226, each respective signal being the logical AND of a respective bit from inverter 224 and respective bit from AND circuit 191. As a result, the twenty bits on line 226 indicate which functional units have pending memory access requests, with the exception of the functional unit which most recently was given access to memory 120.

The twenty bit signal on bus 226, representative of those functional units having pending memory access requests, is delivered to the "0" input of a twenty bit multiplexor 228. At the same time, this twenty bit signal on bus 226 is delivered to the first input of an AND circuit 230. The second input of AND circuit 230 is the twenty bit signal on bus 216 identifying the "other bank" requests. The output of AND gate 230 is a twenty bit signal, each bit of which is the result of a logical AND of respective single signals on bus 226 and bus 216. Thus, the output of AND circuit 230 is a twenty bit signal indicating which of the twenty functional units have a pending memory access request which is directed to the opposite bank of memory 120. This twenty bit signal is applied to "1" input of twenty bit multiplexor 228. At the same time, the twenty-bit output of AND circuit 230 is applied to a twenty bit OR gate 231. The output of twenty bit OR gate 231 is a one bit signal which has a value of "1" if any of the twenty bits output from AND gate have a value of "1". The output of twenty bit OR gate 231 is delivered to the control input of multiplexor 228. As a result of these connections, multiplexor 228 will select the twenty bit output of AND circuit 230 if any of the outputs of AND circuit 230 have a one value. Otherwise, multiplexor 228 will select the twenty bit signal on bus 226. The end result is that the twenty bit output of multiplexor 228 will identify those memory access requests which are directed to the other bank of memory 120 (and access requests for channels in which bank arbitration is disabled), unless none of the memory access requests are directed to the other bank, in which case the output of multiplexor 228 will identify all of the memory access requests, regardless of bank.

The twenty bit output of multiplexor 228 is delivered to a priority encoder 230. Priority encoder 230 includes circuitry for prioritizing the twenty functional units which may access memory 120. Those functional units with high priority for access to memory, such as video decoder 104, will be selected by priority encoder above those functional units with low priority for memory access, such as host interface 112. Priority encoder 230 responds to a twenty bit input signal by generating a five bit binary-encoded output signal on bus 232. The five bit signal on bus 232 identifies the functional unit having a pending access request (as indicated by a "1" value and the corresponding location of the twenty bits input to priority encoder 230) which has the highest priority for access to memory 120. This selected functional unit is then permitted access to memory 120.

Specifically, the signal on bus 232 is delivered to memory 182 as a read address, causing memory 182 to output onto bus 154, the memory access request located in the corresponding location in memory 182. At the same time, a CHANNEL VALID signal is delivered on line 157 to the address generator, indicating that there is a valid channel access request on bus 154. In response, when address generator 124 completes any then-in-process accesses, address generator 124 reads the 32-bit memory access request on bus 154.

The CHANNEL VALID signal is generated by a twenty-bit OR gate 233. The output of OR gate 233 is a "1" value whenever there are any "1" value bits being output from multiplexer 228. Accordingly, the CHANNEL VALID signal indicates that there is at least one valid channel access request pending in arbitrator 122, and therefore, (by operation of the above-described circuitry) there is a valid memory access awaiting access by memory address generator 124 via bus 154.

It will be noted that, by operation of the above circuitry, the memory access request available on bus 154, will reflect (within one clock cycle), the highest priority memory access request received by arbitrator 122. Accordingly, whenever address generator 124 responds to the CHANNEL VALID signal on line 157 by reading the memory access request from bus 154, the highest priority pending request will be obtained.

The signal on bus 232 is delivered to a last channel register 234, used by controller 197 to store the last channel (functional unit) granted access to memory. Whenever address generator 124 begins processing of a memory access request, address generator 124 causes the last channel register 234 to store the current channel number. Thus, address generator 124 will thereafter contain the channel number for the channel most recently granted access to memory.

As will be discussed in further detail below, when address generator 124 completes processing of a memory access request, address generator 124 asserts a WRITE BACK signal on line 156, which is received by controller 197. Controller 197 responds to the WRITE BACK signal by storing a substitute address and count delivered on bus 155, through multiplexer 181 into the storage location for the current channel in memory 182. Thus, when a new base address and count is written back to arbitrator 122, the new base address and count are stored in memory 182 in the same manner as a new memory request.

Controller 197 also responds to the WRITE BACK signal by determining whether the address/count signals on lines 155 being written back from the address generator 124, indicate completion of all of the originally-requested memory accesses. If so, controller 197 reads the last channel register 234 to determine the channel which made the request, and delivers a "0" signal on the corresponding line of bus 195 leading to AND circuit 193, thus causing the corresponding bit position to be cleared from register 184. Thus, when address generator 124 completes processing of a memory access request, the bit in register 184 indicating a pending memory access request from that channel, is cleared from register 184.

The five bit signal output from last channel register 234 is also delivered to a decoder 236 which generates a twenty bit signal on bus 202. This twenty bit signal on bus 202 identifies, as noted above, the functional unit which was previously provided access to memory 120. Accordingly, after selection of a channel, that channel will be identified by the twenty bit signal on bus 202 and prevented from subsequent selection in the next arbitration process.

In the specific embodiment discussed herein, some of the channels (particularly, those used for video decoding) generate frequent memory accesses and must have particularly high priority for memory access. Accordingly, controller 197 handles these channels in a special manner. Specifically, arbitrator 122 interacts with address generator 124 to ensure that access requests from these channels are completely satisfied, and no substitute requests are written back to memory 182, regardless of the number of memory locations requested and regardless of whether page crossings are encountered. To achieve this goal, whenever the arbitration process selects a memory access request from one of these highest priority channels, controller 197 thereafter will ignore any WRITE BACK signals returned from address generator 124 unless the count delivered over bus 155 indicates that the memory access request has been completely satisfied. Furthermore, (as noted below) address generator 124 will not read a new request from memory 182 until the access is completely satisfied. Accordingly, access requests from highest priority channels, once serviced, will be executed to completion without regard to page crossings.

Since, in this embodiment, access requests from these highest priority channels will always be executed to completion, once an access request from a highest priority channel has been selected for servicing by controller 197, controller 197 immediately clears the associated bit from register 184. This allows the requesting channel to deliver a further request into memory 182 while the preceding request is still being serviced, which further enhances the channel's bandwidth to memory.

Figure 3A:
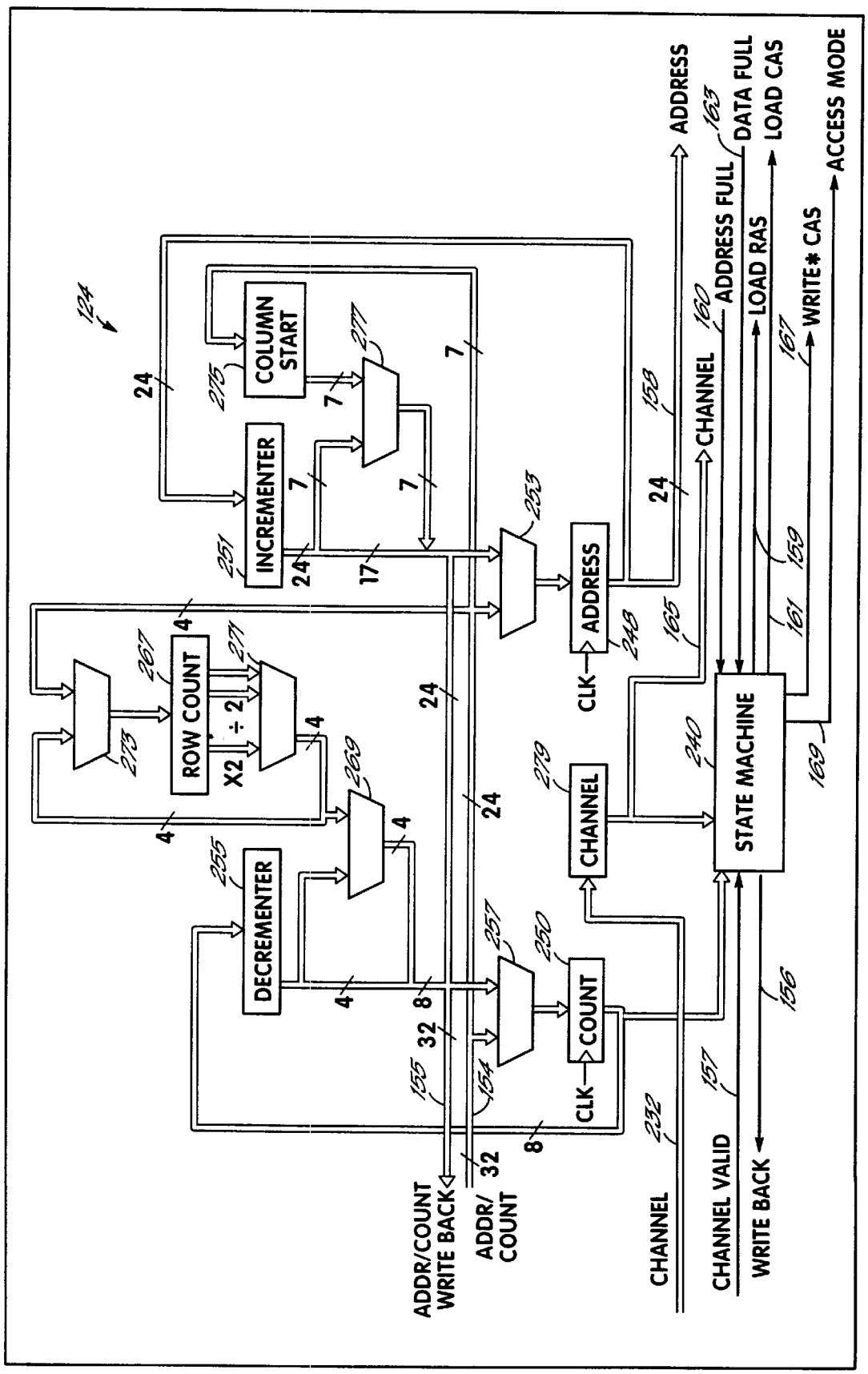
FIG. 3A is a block diagram of the address generator of FIG. 1, configured for retrieval of blocks of memory in response to single memory access requests in accordance with principles of the present invention.

Referring now to FIG. 3A, the structure of address generator 124 may be understood. Address generator 124 receives as an input, bus 154 containing the address and count data for a memory access request selected by arbitrator 122. In response to the address and count signal on bus 154, address generator 124 generates outputs on bus 158, specifically, virtual addresses of memory locations to be accessed in response to the request received on bus 154. As noted above, address generator 124 generates a sequence of multiple accesses, to a sequence of memory locations, in response to a single memory access request received on bus 154. This sequence of virtual addresses is produced on bus 158, until the buffers in DRAM interface 126 become full, and an ADDRESS FULL or DATA FULL signal is asserted on line 160 or 163. The delivery of each memory address is accompanied by a LOAD RAS signal on line 159 or a LOAD CAS signal on line 161. A LOAD RAS signal indicates that a new row address should be loaded into memory 120, and is asserted whenever a new channel is being serviced, and/or there is a crossing to a new memory page.

When all of the potentially multiple addresses corresponding to a single access request received via bus 154 have been output by address generator 124 (or when address generation ceases temporarily due to a page crossing in a lower-priority channel, or is suspended due to a lower-priority channel reaching its predetermined maximum number of uninterrupted accesses), a WRITE BACK signal is asserted on line 156, informing arbitrator 122 that the preceding memory access request has been suspended or completed and a substitute memory access request can be loaded through bus 155.

Address generator 124 comprises various combinational logic, and a state machine 240 generating signals which control the combinational logic and generate appropriate signals on output lines 156, 159, 161, 167 and 169 in response to input signals on lines 157, 160 and 163.

Included in the combinational logic of address generator 124, is an address register 248 and a count register 250. The output of address register 248 forms the virtual address signal on bus 158. The count register 250 is used to count the number of memory addresses remaining to be generated by the address generator 124. Also included is a channel register 279 for storing, from lines 232 from arbitrator 122, an identification of the channel associated with the request stored in registers 248 and 250, and delivering a current channel signal on lines 165 to DRAM interface 126.

The outputs of registers 248 and 250 are passed through feedback loops which permit incrementing of the address in register 248 and decrementing of the count in register 250. Specifically, the output of address register 248 is connected to an incrementer 251. The output of incrementer 251 connects to a first input of a multiplexer 253. State machine 240 controls incrementer 251 and multiplexer 253 to increment the address stored in address register 248 (using incrementer 251) by steps of 8, 16, 32, 128 (or potentially other programmable numbers) and then deliver the output of incrementer 251 through multiplexer 253 for storage in address register 248. Similarly, the output of count register 250 is connected to a decrementer 255. The output of decrementer 255 connects to a first input of a multiplexer 257. State machine 240 controls decrementer 255 and multiplexer 257 to decrement the count stored in count register 250 (using decrementer 255) by steps of 2, and then deliver the output of decrementer 255 through multiplexer 257 for storage in count register 250.

Whenever a new memory access request is loaded into address generator 124, the values for address and count of the new access request must be loaded into registers 248 and 250. This is accomplished through multiplexers 253 and 257. Specifically, the address portion of signals on bus 154 are delivered to a second input of multiplexer 253, and the count portion of the signals on bus 154 are delivered to a second input of multiplexer 257. When address generator 124 is finished servicing a memory access request (and another valid request is available as indicated by the CHANNEL VALID signal on line 157), state machine 240 directs multiplexers 253 and 257 to load address and count signals on bus 154 to the inputs of address register 248 and count register 250 through multiplexers 253 and 257, respectively, thus causing the base address and count of the new request to be loaded for farther processing.

Address generator 124 also includes a row count register 267 for storing a row count, used in generating addresses for blocks of memory locations as discussed below. When a new memory access request is loaded into address generator 124, row count register 267 is loaded from bus 154 with the four least significant bits of section 188 of the memory access request. These four bits indicate the number of rows in the block to be accessed. The output of row count register 267 is delivered (via a multiplexer 271, discussed below) to a first input of a four-bit multiplexer 269. The second input of multiplexer 269 is connected to the four least significant lines of the output of decrementer 255. The output of multiplexer 269 is delivered to the four least significant bits of the first input of multiplexer 257. (The four more significant bits of the output of decrementer 255 are directly connected to the four more significant bits of the first input of multiplexer 257.)

As discussed below in further detail, as address generator 124 is generating memory addresses within a single column in response to a rectangular block access, decrementer 255 reduces the row count in count register 250 to track the number of rows output in the current column. During this period, multiplexer 269 is controlled to deliver the four bits obtained from decrementer 255 to multiplexer 257. However, when address generator 124 completes generating addresses for a column, and prepares to begin generating addresses for the next column, multiplexer 269 delivers the four bits derived from row count register 267 to multiplexer 257, which effectively resets the row count in the count register 250 for the new column.

The output of row count register 267 is delivered to multiplexer 269 via a further multiplexer 271. Multiplexer 271 selects one of three values derived from the value stored in row count register 267, for delivery to multiplexer 269. Specifically, multiplexer 271 can deliver the bits of row count register 267 in unmodified form, or can deliver the bits of row count register shifted to the right (producing a "÷2" binary value equal to one-half the value in the row count register), or can deliver the bits of row count register shifted to the left, with a "1" value shifted into the least significant bit (producing a "×2" binary value equal to one more than twice the value in the row count register). The value output by multiplexer 271 is stored back into row count register 267 via multiplexer 273 (which is also used to deliver a four bit value into register 267 from bus 154). The use of the "÷2" and "×2" functions of multiplexer 271 will be noted in the following discussion of FIGS. 3C–3G.

Address generator 124 further includes a column start register 275 for storing a portion of an address, used in determining the first address of a column of memory locations when performing a block memory access as discussed below. When a new memory access request is loaded into address generator 124, column start register 275 is loaded from bus 154 with the seven least significant bits of section 192 of the memory access request. These seven bits identify a location at which each column of memory addresses in the block begins. The output of column start register 275 is delivered to a first input of a seven-bit multiplexer 277. The second input of multiplexer 277 is connected to the seven least significant lines of the output of incrementer 251. The output of multiplexer 277 is delivered to the seven least significant bits of the first input of multiplexer 253. (The seventeen more significant bits of the output of incrementer 251 are directly connected to the seventeen more significant bits of the first input of multiplexer 253.)

As discussed below in further detail, as address generator 124 is generating memory addresses within a single column, incrementer 251 increases the address in register 248 to identify a current address in the current column. During this period, multiplexer 277 is controlled to deliver the four bits obtained from incrementer 251 to multiplexer 253. However, when address generator 124 completes generating addresses for a column, and prepares to begin generating addresses for the next column, multiplexer 277 delivers the seven bits from column start register 275 to multiplexer 253, which effectively resets the address in register 248 to the appropriate location (row) in the new column.

As noted above, when accesses in response to a request are completed, or a request reaches the maximum number of sequential accesses allowed to the corresponding channel, address generator 124 terminates processing of that access request, and causes the next address to be accessed, and a count of accesses remaining, to be written back to the arbitrator 122 via bus 155. As can be seen in FIG. 3A, bus 155 is connected to the concatenated outputs of incrementer 251/multiplexer 277 and decrementer 255/multiplexer 269. As a result, the signals on bus 155 will at all times indicate the next address and count of memory addresses required to complete a request, so that this data can be read into arbitrator 122 via bus 155 at any time. Accordingly, when a page crossing is encountered, state machine 240 asserts the WRITE BACK signal on line 156, causing arbitrator 122 to read and store the address and count available via bus 155 as discussed above.

Figure 3B:
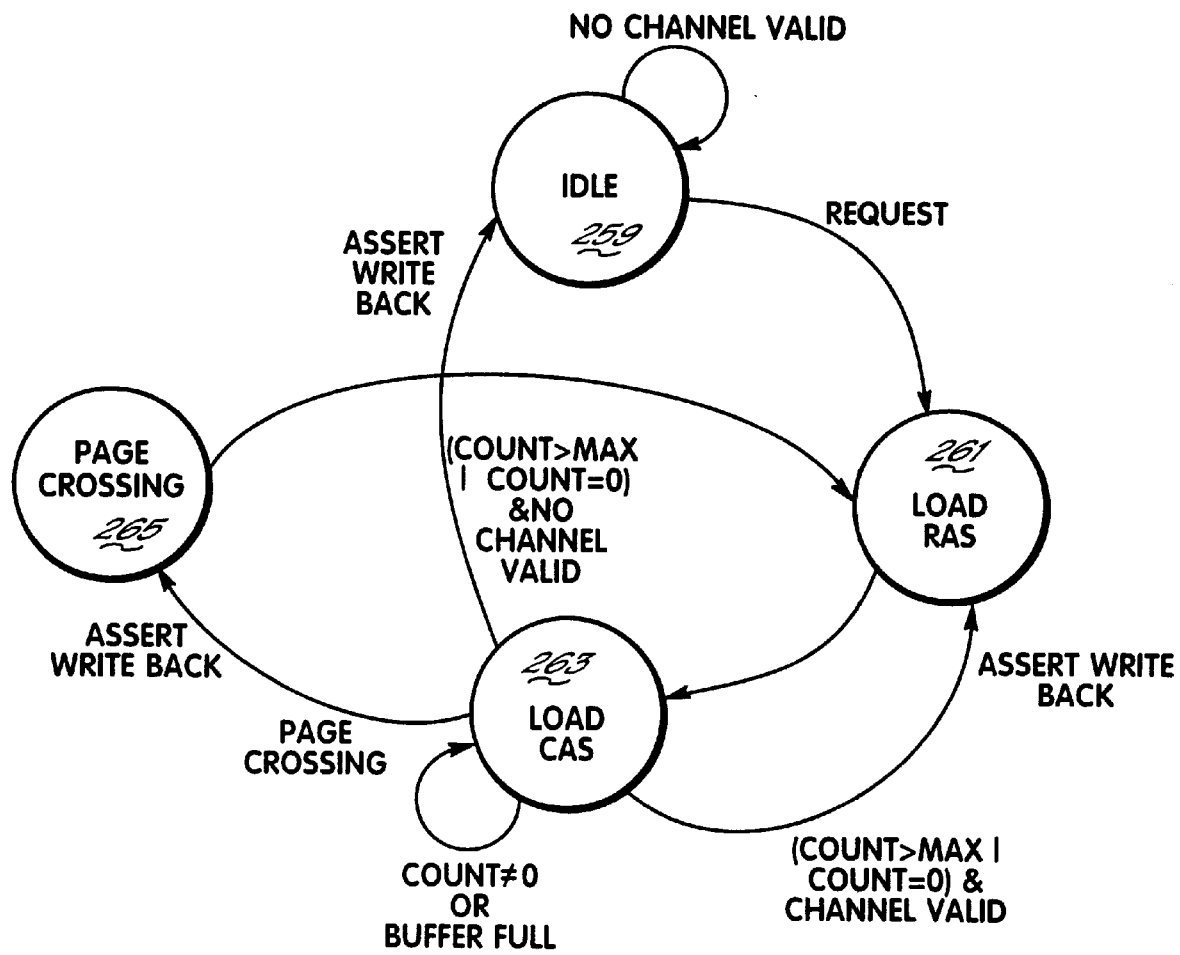
FIG. 3B is a state transition diagram illustrating the states and transitions between states performed by the state machine of FIG. 3A.

Referring now to FIG. 3B, a simplified state transition diagram for state machine 240 can be explained. State machine 240 has four states, an IDLE state 259, a LOAD RAS state 261, a LOAD CAS state 263 and a PAGE CROSSING state 265.

State machine 240 begins in the IDLE state 259, and remains in this state so long as there is no CHANNEL VALID signal indicating a pending memory access request. If, however, a CHANNEL VALID signal is received, indicating a memory access request has been made, state machine 240 transitions from the IDLE state 259 to a LOAD RAS state 261. In the LOAD RAS state, state machine 240 asserts the LOAD RAS signal on line 159, indicating that a new row address must be loaded into memory to access the virtual address identified on bus 158. During the transition into the LOAD RAS state, state machine 240 causes the memory access request on bus 154 to be loaded into registers 248 and 250, and the associated channel to be loaded into register 279. As a result, the first virtual address for the selected channel is delivered to bus 158 (and will be converted into a row address by DRAM interface 126). From the LOAD RAS state, state machine 240 immediately transitions to the LOAD CAS state 263. In the LOAD CAS state, state machine 240 asserts the LOAD CAS signal on line 161, indicating that a column address must be loaded into memory to access the virtual address identified on bus 158. During this transition from the LOAD RAS state to the LOAD CAS state, no changes are made to the virtual address and count stored in registers 248 and 250, so that the base virtual address stored in register 248 during the transition to the LOAD RAS state will remain in register 248, and be converted into a column address by DRAM interface 126.

Once arriving at the LOAD CAS state 263, state machine 240 will remains in the LOAD CAS state 263, producing subsequent virtual addresses in accordance with the loaded request, until either (a.) the count of virtual addresses to be produced reaches zero, (b.) there will be a page crossing, or (c.) the access request exceeds a predetermined maximum number of accesses permitted to the associated channel. While state machine 240 thus remains in the LOAD CAS state, during each clock cycle, state machine 240 uses the circuitry of address generator 124 to produce appropriately incremented addresses in register 248 and decremented count values in register 250. (Unless a buffer becomes full as indicated by an ADDRESS FULL signal on line 160 or a DATA FULL signal on line 163, in which case state machine 240 remains in the LOAD CAS state, but neither increments the address in register 248 nor decrements the count in register 250 until neither buffer is full.

If, during generation of addresses, state machine 240 determines that there will be a page crossing upon output of the next address, state machine 240 transitions from the LOAD CAS state 263 to the PAGE CROSSING state 265. During this transition, state machine 240 will assert the WRITE BACK signal on line 156, causing the next address and count to be written back into arbitrator 122 (for lower priority channels) as discussed above. From the PAGE CROSSING state, transitions directly to the LOAD RAS state, causing the LOAD RAS signal to be asserted, alerting the DRAM interface 126 that a new row address is forthcoming. During this transition to the LOAD RAS state, if the next address and count were written back to the arbitrator 122 (for a lower priority channel), a new address, count and channel number are loaded into address generator 124 from arbitrator 122.

If, instead, the count reaches zero in the LOAD CAS state 263 (i.e., the access request is completed), or the corresponding channel has been provided its maximum number of uninterrupted accesses in the LOAD CAS state 263, state machine 240 transitions to either the IDLE state 259 or to the LOAD RAS state 261. If the CHANNEL VALID signal on line 157 is not asserted when the count reaches zero, state machine 240 will proceed to the IDLE state 259 to await another memory access request. If, however, the CHANNEL VALID signal on line 157 is asserted when the count reaches zero, state machine 240 will proceed to the LOAD RAS state 261, load new address, count and channel values into registers 248, 250 and 279, respectively, and assert the LOAD RAS signal to prepare the DRAM interface 126 to receive a new row address for a (potentially) new channel. In either case, when state machine 240 transitions from the LOAD CAS state 263 to either the IDLE state 259 or the LOAD RAS state 261, state machine 240 asserts the WRITE BACK signal on line 156, in response to which arbitrator 122 determines whether the count for the current access reached zero: if not, a substitute request from bus 155 is stored, if so, the request is cleared from register 184, as discussed above.

Referring now to FIG. 3C, the manner in which address generator 124 generates accesses to blocks of memory in the LOAD CAS state in response to memory requests on bus 154, can be more fully understood. Specifically, the DRAM memory space 120 is mapped as a rectangular memory area. This rectangular memory area has columns which are 32 bits in width, i.e., four 8 bit bytes in width. Specifically, the first row of the first column of the memory map, includes those virtual memory locations at virtual address 0×000000h (where h indicates a hexadecimal number) to virtual address 0×000003h. The first row of the second column includes those memory entries at virtual address 0×000004h through virtual address 0×000007h. Thus, as can be seen in FIG. 3B, the first two columns of the memory map are formed from the first 128 memory locations in DRAM memory 120. These 128 locations are arranged into two columns and 16 rows with each column being 32 bits wide.

As can be seen in FIG. 3C, the memory space, when viewed in this rectangular form, can be accessed by address generator 124 in block format. Specifically, a memory access request delivered to address generator 124 identifies a base address and a number of columns and a number of rows starting from that base address to be accessed by address generator 124. Columns in the address map shown in FIG. 3C are 32 bits or four eight bit words wide. However, the data bus internal to the ASIC 100 is 64 bits wide. Accordingly, address generator 124 interacts with DRAM interface 126 to pack two 32 bit memory segments into each memory access.

Since neighboring odd and even columns are formed from sequential locations in DRAM memory 120, when a memory access request identifies a base address in an even column in the memory map of FIG. 3C, the corresponding entry from that column and the next column to the right, are accessed and returned together as one 64 bit word, such as shown is shown at 252 in FIG. 3C. In such a situation, (and assuming memory is being accessed in a "frame" rather than "field" mode, as discussed below) subsequent memory accesses will retrieve neighboring 32 bit words from these two columns in subsequent rows, such as shown at 254 and 256.

Although the foregoing method of accessing adjoining columns simultaneously is used for any accesses beginning with even columns, in many cases an access will either begin or end at an odd numbered column. For example, an access beginning in the third column illustrated in FIG. 3B, and proceeding for three rows as indicated at 252, 254, and 256, might terminate at the fifth column of the memory map. In such a case, memory address generator 124 will continue to access multiple segments of memory in parallel, however, these multiple segments of memory will be grouped vertically along columns rather than horizontally across two columns. For example, to complete a block access of three rows and three columns beginning at virtual address 0×000098h, after accessing the first two columns as shown at 252, 254 and 256, address generator 124 will access the third column as shown at 258 and 260 by blocking together 32-bit entries from two rows of the third column. Similarly, an access to a memory block which begins at an odd numbered memory column will also cause address generator 124 to initially return memory locations grouped into 64 bit blocks arranged vertically through the first column. In 32-bit mode, access requests are permitted to begin or end in odd columns (but not both) with the illustrated results.

The memory access described above is in "frame" mode, i.e., memory locations in adjacent rows are accessed. Address generator 124 also facilitates a "field" mode of memory access, in which alternating rows of memory are accessed. "Field" access mode is particularly useful when video data is stored in memory, and output as two fields of alternating scan lines.

To illustrate the use of "field" mode, and accesses which begin at an odd numbered memory column, a memory access request for four rows and three columns beginning at virtual address 0x00004Ch, in field mode, will be illustrated. This access request will retrieve two 32 bit memory blocks located at alternating rows in the first column, as shown at 262, followed by another two 32 bit memory blocks at alternating rows in the first column, as shown at 264, both pairs of blocks including two 32-bit entries from a single column. Thereafter, memory address generator 124 will begin accessing two columns in parallel, from alternating rows, as shown at 266, 268, 270 and 272.

The foregoing method of operation of address generator 124 allows functional units of the ASIC 100 to access horizontally and vertically defined blocks of memory. Such a functionality can be particular useful in the case of video processing, in which it is often necessary to retrieve, manipulate and store blocks of pixel information to perform video signal decompression and output. By facilitating such memory access through the use of relatively high level commands from functional units, address generator 124 reduces the programming effort needed to implement various video decoding standards and reduces the traffic that must pass through bus 150 between functional units 102 to 112 and arbitrator 122.

The foregoing discussion of memory access patterns in connection with FIG. 3B relates to those situations in which the physical width of DRAM memory 120 is 32 bits or less. However, as will be noted below in connection with FIGS. 4E through 4G, the physical arrangement of DRAM memory 120 may be 64 bits wide in some applications. In these situations, the ASIC 100 is put into a 64 bit addressing mode. In the 64 bit addressing mode, all of the functional units 102 through 112 of the ASIC 100 do not expect or attempt to access single odd numbered columns in the memory map of FIG. 3B. Rather, if a memory block access begins or ends on an odd numbered column, in 64 bit mode, the memory accesses that result will include the preceding or subsequent column, respectively, so that the accessed memory block will always start and end at an even column. In the 64 bit mode of the ASIC 100, the functional units 102 to 112 recognize that additional memory locations will be accessed when a requested block begins or ends on an odd numbered column, and will appropriately discard any additional data from unwanted columns The specific operations performed by address generator 124 under control of state machine 240 to access rectangular memory blocks in response to memory access commands on bus 154, are illustrated in FIGS. 3D through 3G. For the purpose of simplicity, these steps will be discussed in the context of a request from a high-priority channel, such as a video decoding channel, which is permitted an unlimited number of uninterrupted accesses to memory locations forming a rectangular block.

Figure 3D:
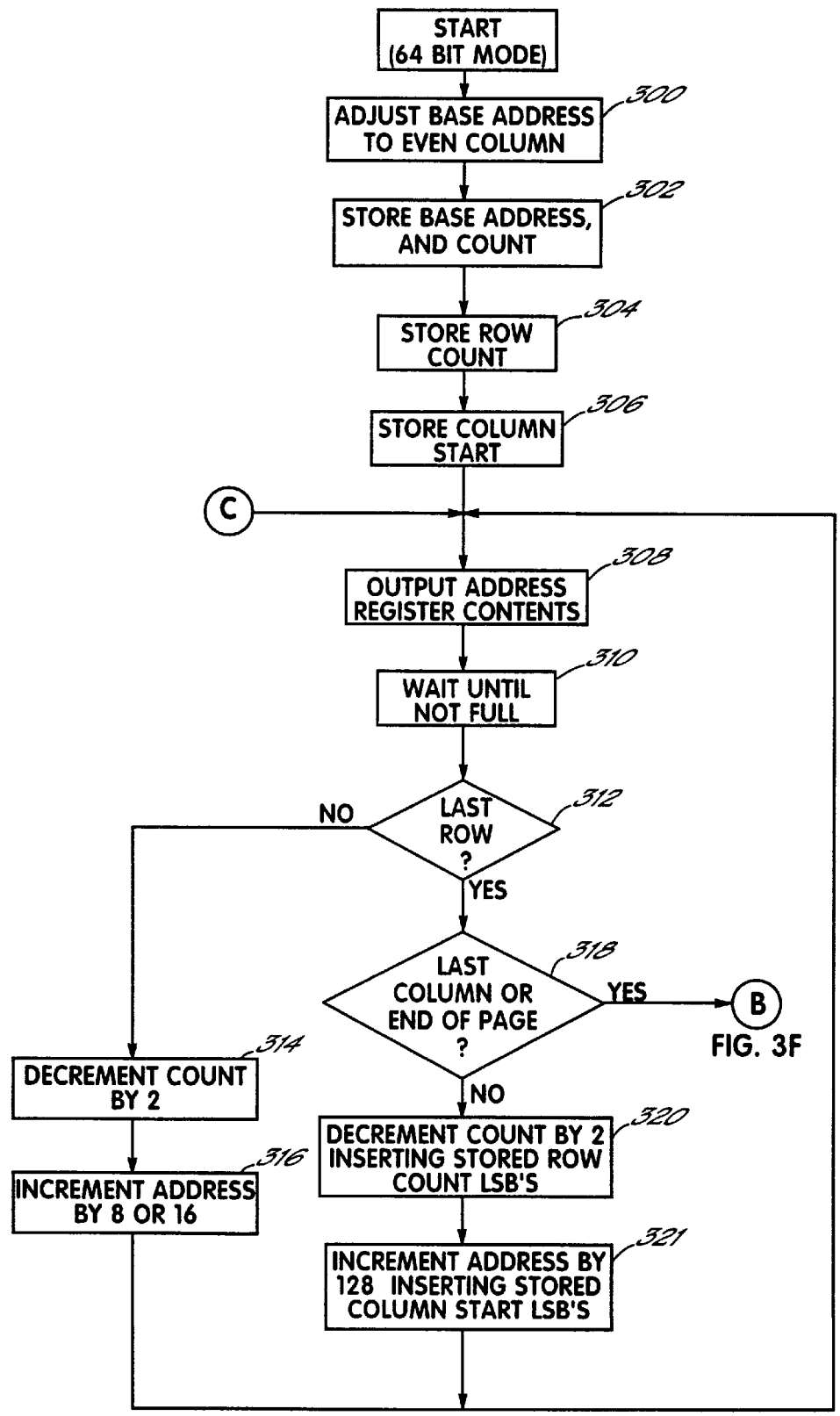
FIGS. 3D, 3E, 3F and 3G are flow charts of the operations performed by the address generator of FIG. 3A in generating memory addresses for memory blocks in 32-bit and 64-bit modes.
Figure 3E:
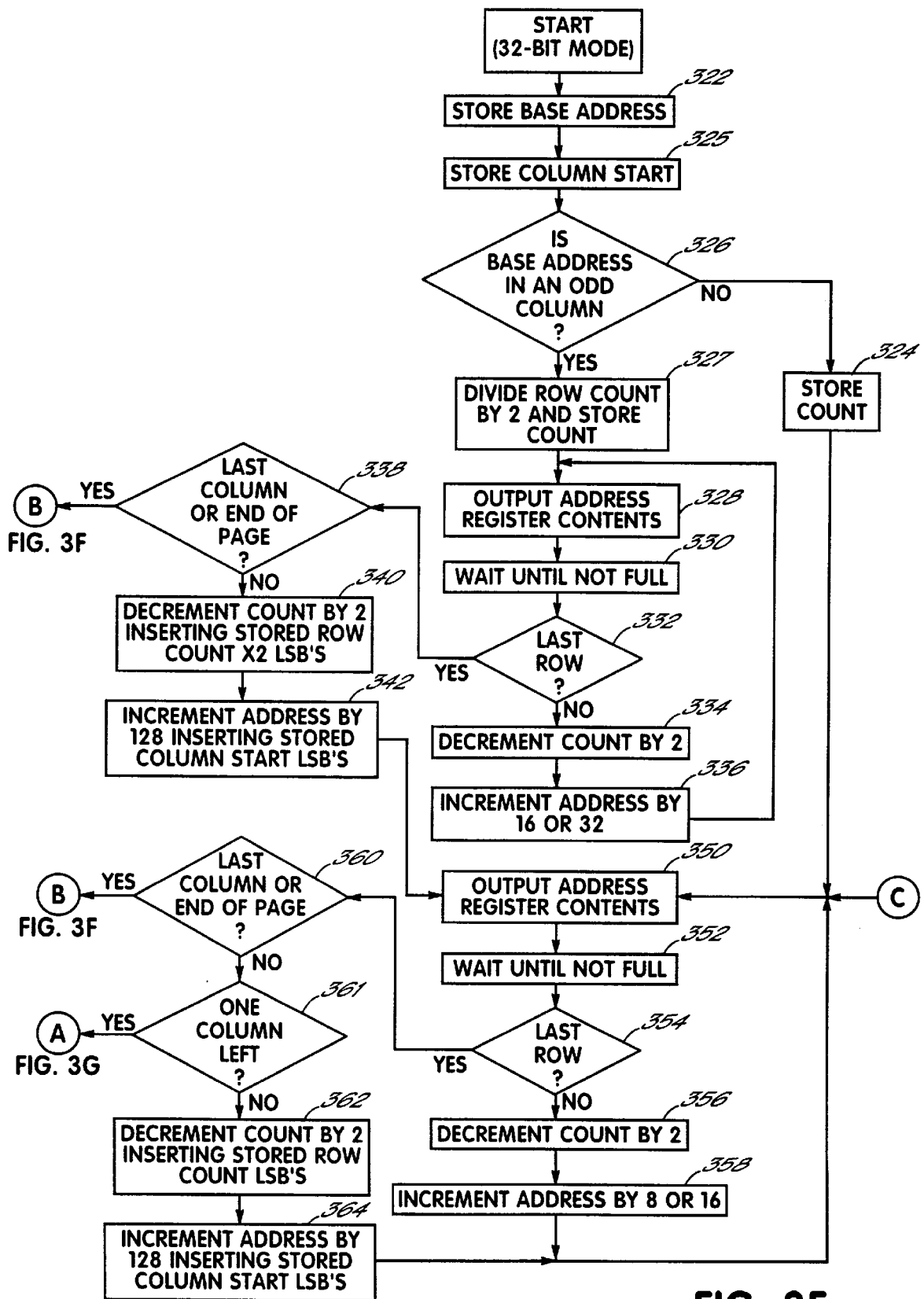

Referring to FIG. 3D, in 64 bit mode, in a first step address generator 124 stores in registers 248 and 250 the base address and the number of requested rows and requested columns indicated by a memory access request on bus 154 (step 300 ). (In 64-bit mode, memory 182 in arbitrator 122 adjusts 302 the base address before it is output on bus 154, so that the base address identifies an even rather than an odd column.) The result of these steps is to cause memory address generator 124 to retrieve even groups of columns beginning at the identified base address, regardless of whether the base address of an access request points to an odd or an even column location.

At the same time it obtains the base address, address generator 124 stores the four least significant bits of the count section 188 of the request on bus 154, into the row count register 267 (step 304) and stores the seven least significant bits of the address section of the request on bus 154, into the column start register 275 (step 304). This prepares these registers for later use in performing block accesses.

Address generator 124 then enters a loop including steps 308, 310, 312, 314, 316, 318, 320 and 321 in which address generator 124 sequentially produces addresses on bus 158 indicating the addresses of memory locations in the block requested by the memory access request.

In step 308, address generator 124 outputs the address currently stored in register 248. Thereafter, in step 310, address generator 124 waits if there is an ADDRESS FULL signal on line 160, or DATA FULL signal on line 163, to ensure that memory interface 126 is prepared for the next memory address.

When there is no FULL signal, address generator 124 proceeds to step 312, and determines if the address output in step 308 was the last address in the current column, i.e., if all of the requested rows from the current column have been output. This is determined from the four least significant bits stored in the count register 250; if these four bits have a decimal value of "0000" or "0001", this indicates that the requested number of rows for the current column have been output. In either case, the next decrement of the count register will the generate a borrow from the four more significant bits of the count register. (The four more significant bits of the count register 250 identify one less than the number of requested columns, divided by two; input register 180 of arbitrator 122 divides the column count in an incoming request by two prior to delivering the request for storage in memory 182 and later forwarding to register 250. Since a borrow from the four less significant bits of the count register indicates completion of two columns of addresses, it is appropriate that the column count stored in register 250 identify one-half of the desired number of columns.)

If the most recent address was not the last address in the column, address generator 124 uses decrementer 255 to decrement the count in register 250 by two (step 314 ), and simultaneously uses incrementer 251 to increment the address by 8 (if accesses are being made in "frame" mode), or 16 (if memory is being accessed in "field" mode) (step 316). Thereafter, address generator 214 returns to step 308 and outputs the resulting new address from register 248.

If, however, the last memory location in the current column has been produced, address generator 124 proceeds from step 312 to step 318, at which it determines whether address generator 124 has completed all of the columns to be output. This may be determined from the four more significant bits in count register 250. If these four more significant bits have a binary value of "0000", this indicates that no more columns were requested for output. Alternatively, address generator 124 can compare the number of addresses that have been generated to the maximum number of uninterrupted memory accesses permitted to the current channel. If the current column is the last column, address generator 124 proceeds to step 392 of FIG. 3F, in which the WRITE BACK signal is asserted on line 156, as discussed further below.

If, however, the contents of the count register indicate that there are additional columns to be output, address generator 124 will proceed from step 318 to steps 320 and 322 (which are performed simultaneously in hardware) in which address generator 124 uses decrementer 255 to decrement the count in register 250 by two (step 320), and simultaneously uses incrementer 251 to increment the address by 128 (step 324). The address is incremented by a value of 128 to ensure that there is a carry into the seventeen more significant bits of the address as a result of 324.

In addition to the above, in steps 320 and 322, multiplexers 269 and 277 are activated to cause the four bits stored in row count register 267 to be substituted for the four least significant bits of the output of decrementer 255, and to cause the seven bits stored in column start register 275 to be substituted for the seven least significant bits of the output of incrementer 251. As a result of this operation, the count of columns identified in the four most significant bits is reduced by one, and the count of rows identified in the four least significant bits is equal to the count of rows in the original request. Further, the contents of address register 248 will be updated to identify the address of the first memory location in the new column of the requested block.

It will be noted that in step 318, when address generator 124 is determining whether to sequence to a new column, address generator 124 may also detect whether a page crossing would occur in the physical memory making up memory 120 as a result of sequencing to the new column. In 64 bit mode, a page crossing will occur if any of the twelve most significant bits of the address are changed from one memory access to the next. Accordingly, each time memory address generator 124 passes through step 318, memory address generator 124 also evaluates whether the next address increment will produce a carry into the twelve most significant bits of the address. In case of a page crossing, address generator 124 discontinues processing of the memory access request (temporarily), by proceeding to step 392 of FIG. 3F, asserting the WRITE BACK signal, and continuing as discussed below.

As noted above, slightly different processing occurs in 32 bit mode as compared to 64 bit mode. As a first distinction, in 32-bit mode, DRAM interface 126 produces two column addresses for each address provided to it by address generator 124. (Furthermore, when memory 120 is formed of SDRAM memory chips (which are 16-bits in width), memory 120 is programmed to "burst", i.e., read or write, two memory locations for each column address delivered thereto.) Accordingly, in 32-bit mode, address generator 124 need only deliver addresses for half of the memory locations being accessed. (The manner in which memory 120 is to respond, including the manner in which a "burst" of locations is to be produced, is identified by the ACCESS MODE signal from state machine 240 on lines 169. )

Furthermore, special processing is performed in 32-bit mode to permit access to single columns illustrated in FIG. 3C. Specifically, referring to FIG. 3E, in 32 bit mode, memory 182 of arbitrator 122 does not make any adjustment to the base address of a request. Rather, address generator stores the base address (step 322) in its original form. Address generator 124 simultaneously stores the column start (step 325).

If the base address is in a odd column (step 326), special processing must be performed to output pairs of 32 bit memory locations moving down the first column, such as shown as 262 and 264 in FIG. 3C. To facilitate this processing, if the base address is in an odd column, memory 182 of arbitrator 122 delivers a row count value which is divided by two, so that this new row count value, having half of its original value, is stored in count register 250 and row count register 267 (step 327, which is performed simultaneously with steps 322 and 325 ). This is done to account for the fact that, while address generator 124 is producing addresses for stacked pairs of 32-bit memory locations, a single output address identifies memory locations in two rows, and so the number of addresses output in the first column will be only half the number of requested rows. (At the same time, an ACCESS MODE signal is produced on lines 169, to instruct memory 120 to "burst" two memory locations which are spaced 8 (for "frame" mode) or 16 (for "field" mode) addresses apart.)

After making this adjustment in step 326, address generator 124 proceeds to step 328 and outputs the contents of address register 248. Next, address generator proceeds to step 330, in which it ensures that DRAM interface buffers are not full. When the ADDRESS FULL and DATA FULL signals are not asserted, address generator 124 proceeds to step 332 at which it determines whether the address output in step 328 was the last address in the current column, i.e., if all of the rows from the current column have been output. As before, this is determined from the four least significant bits stored in the count register 250; if these four bits have a decimal value of "0000" or "0001", this indicates that the requested number of rows for the current column have been output.

If the most recent address was not the last address in the column, address generator 124 uses decrementer 255 to decrement the count in register 250 by two (step 334 ), and simultaneously uses incrementer 251 to increment the address by 16 (if accesses are being made in "frame" mode), or 32 (if memory is being accessed in "field" mode) (step 336). Thereafter, address generator 214 returns to step 328 and outputs the resulting new address from register 248.

If, however, the last memory location in the current column has been produced, address generator 124 proceeds from step 332 to step 338, at which it determines whether all of the requested columns have been output. As before, this may be determined from the four more significant bits in count register 250. If these four more significant bits have a binary value of "0001" or "0000", this indicates that no more columns remain for output. Assuming the contents of the count register indicate that there are additional columns to be output, address generator 124 uses decrementer 255 to decrement the count in register 250 by two (step 320), and simultaneously uses incrementer 251 to increment the address by 128 (to ensure there is a single carry into the seventeen more significant bits of the address) (step 324). In addition, in step 340, multiplexer 269 and 271 are activated to cause the four bits stored in row count register 267, multiplied by 2, to be substituted for the four least significant bits of the output of decrementer 255; this prepares the count register to output a full complement of rows in the upcoming column. Also, in step 342, multiplexer 277 is activated to cause the seven bits stored in column start register 251 to be substituted for the seven least significant bits of the output of incrementer 251. As a result of this operation, the contents of address register 248 will be updated to identify the address of the first memory location in the new column of the requested block. (At the same time, an ACCESS MODE is produced on line 169 instructing memory 120 to "burst" two memory locations which are spaced 4 addresses apart.) Once steps 340 and 342 are completed, address generator 124 will proceed to step 350.

Address generator 124 will also arrive in step 350 if the base address originally delivered with the request identifies an even column. In such a case, address generator 124 will, simultaneously with steps 322 and 325, store an unmodified count produced by memory 182 on lines 154 into registers 250 and 267 (step 324), and proceed directly to step 350.

In step 350, address generator 124 outputs the contents of address register 248. This will output the address of the first row in the next column. Subsequently, in step 352, address generator 124 waits until the DRAM interface buffers are not FULL. When the ADDRESS FULL and DATA FULL signals are not asserted, address generator 124 proceeds to step 354 at which it determines whether the address output in step 350 was the last address in the current column, i.e., if all of the rows from the current column have been output. As before, this is determined from the four least significant bits stored in the count register 250.

If the most recent address was not the last address in the column, address generator 124 uses decrementer 255 to decrement the count in register 250 by two (step 356), and simultaneously uses incrementer 251 to increment the address by 8 (if accesses are being made in "frame" mode), or 16 (if memory is being accessed in "field" mode) (step 358). Thereafter, address generator 214 returns to step 350 and outputs the resulting new address from register 248.

If, however, the last memory location in the current column has been produced, address generator 124 proceeds from step 354 to step 360, at which it determines whether all of the requested columns have been output. As before, this may be determined from the four more significant bits in count register 250. Assuming the contents of the count register indicate that there are additional columns to be output, address generator 124 will proceed from step 360 to step 361, in which address generator 124 determines whether there is exactly one column left to be output. Assuming this is also not the case, address generator 124 proceeds to steps 362 and 364, in which address generator 124 uses decrementer 255 to decrement the count in register 250 by two (step 362), and simultaneously uses incrementer 251 to increment the address by 128 (for reasons noted above) (step 364). Thereafter, address generator 124 returns to step 350 and outputs the new address from register 248.

It will be noted that in steps 338 and 360, when address generator 124 is determining whether to sequence to a new column, address generator 124 may also detect whether a page crossing would occur in the physical memory comprising memory 120, as a result of sequencing to the new column. Accordingly, each time memory address generator 124 passes through steps 338 or 360, memory address generator 124 also evaluates whether the next address increment will cross a page boundary. If so, address generator 124 proceeds to step 392 of FIG. 3F, asserts the WRITE BACK signal, and continues further processing as discussed below.

Figure 3F:
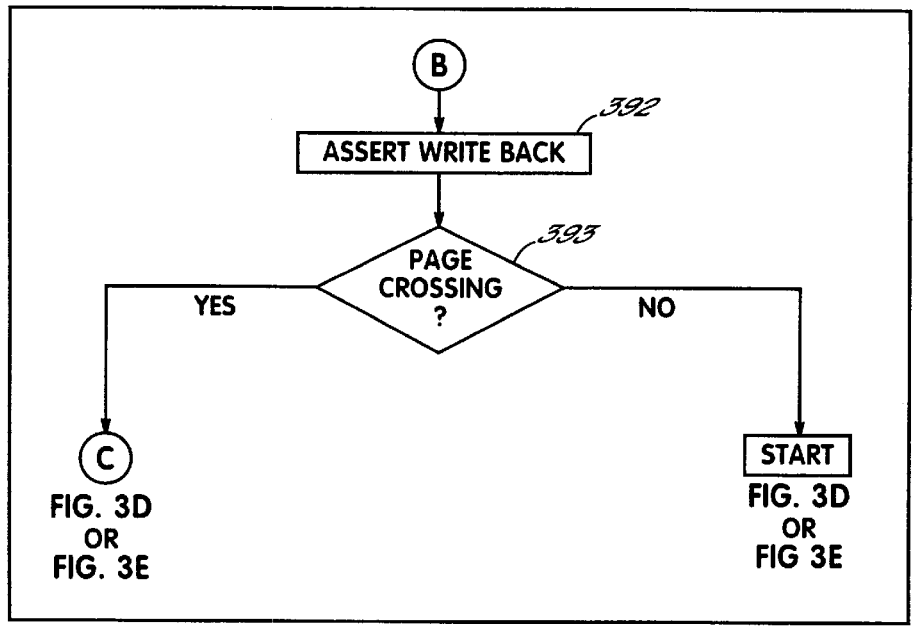
Figure 3G:
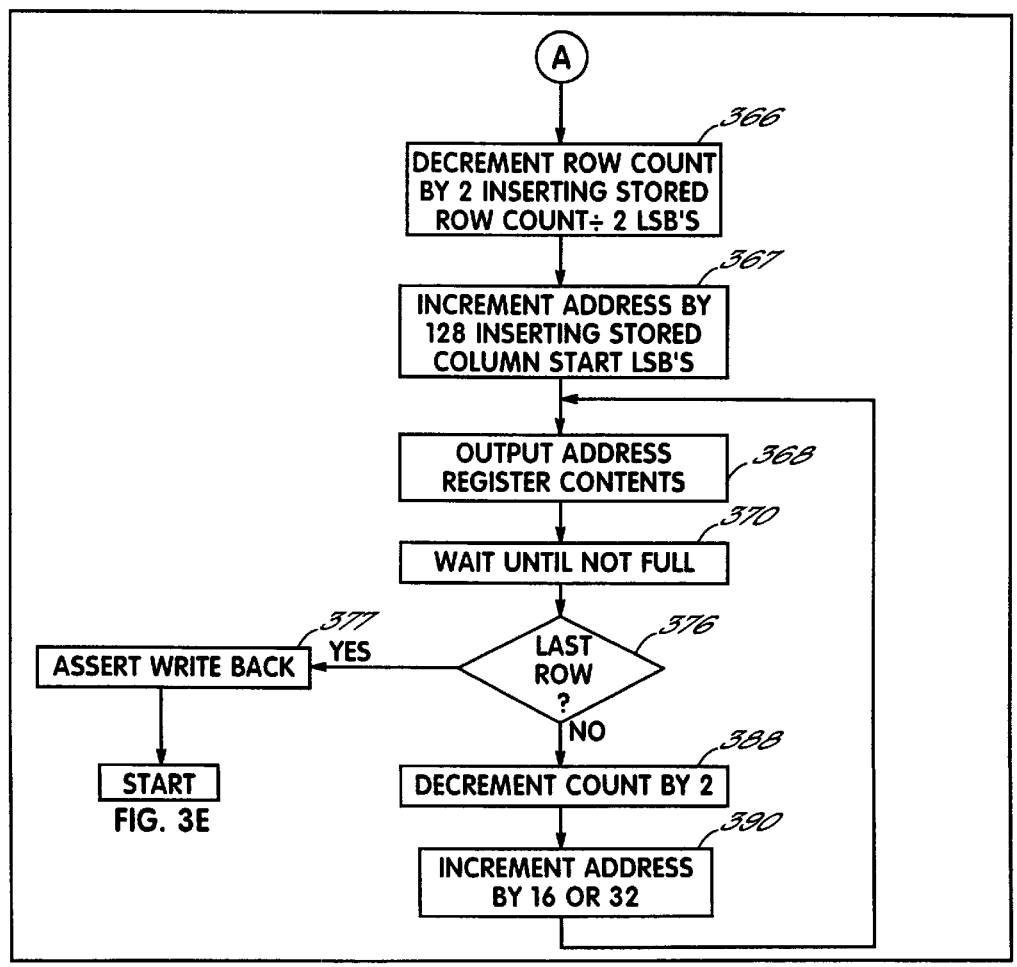

Referring now to FIG. 3F, if at steps 316, 338 or 360, all columns have been output, or the address has reached a page boundary, address generator 124 proceeds to step 392, in which the WRITE BACK signal is asserted. As noted above, access requests are permitted to continue through page crossings. Therefore, if address generator 124 arrived at step 392 due to a page crossing (step 393), address generator 124 proceeds from step 393 directly to step 308 (in 64-bit mode) or step 350 (in 32-bit mode) to continue processing of the request after the page crossing. However, if address generator 124 arrived at step 392 for other reasons, then address generator 124 returns to the starting point in FIG. 3D (in 64-bit mode) or FIG. 3E (in 32-bit mode).

It was noted in step 361 (FIG. 3E), that in 32-bit mode, address generator 124 determines whether there is exactly one column remaining to be output. If this is the case, address generator 124 proceeds from step 361 to steps 366 and 367 of FIG. 3G, in which address generator 124 uses decrementer 255 to decrement the count in register 250 by two (step 366), and simultaneously uses incrementer 251 to increment the address by 128 (for reasons noted above) (step 367). In addition, in step 366, multiplexers 269 and 271 are activated to cause the four bits stored in row count register 267, divided by 2, to be substituted for the four least significant bits of the output of decrementer 255; this prepares the count register to output addresses corresponding to two rows, in the upcoming column. Also, in step 367, multiplexer 277 is activated to cause the seven bits stored in column start register 251 to be substituted for the seven least significant bits of the output of incrementer 251. As a result of this operation, the contents of address register 248 will be updated to identify the address of the first memory location in the new column of the requested block. (Also, simultaneously with these steps, an ACCESS MODE signal is produced on line 169 instructing memory 120 to "burst" two memory locations which are spaced 8 (for "frame" mode) or 16 (for "field" mode) addresses apart.)

Once steps 366 and 367 are completed, address generator 124 will proceed to step 368 and output the contents of address register 248. This will output the address of the first row in the final column. Subsequently, in step 370, address generator 124 waits until the DRAM interface buffers are not FULL. When the ADDRESS FULL and DATA FULL signals are not asserted, address generator 124 proceeds to step 376 at which it determines whether the address output in step 368 was the last address in the last column, i.e., if all of the rows from the last column have been output. As before, this is determined from the four least significant bits stored in the count register 250.

If the most recent address was not the last address in the column, address generator 124 uses decrementer 255 to decrement the count in register 250 by two (step 388) and increment the address by 16 (if accesses are being made in "frame" mode), or 32 (if memory is being accessed in "field" mode) (step 390). Thereafter, address generator 214 returns to step 368 and outputs the resulting new address from register 248. If, however, the most recent address was the last address in the last column, address generator 124 has completed production of addresses for the requested block, and proceeds to step 377 to assert the WRITE BACK signal, causing arbitrator 122 to clear the request as noted above, and then returns to the starting point in FIG. 3E.

The foregoing discussion was made with reference to a high-priority memory access request permitted unlimited uninterrupted memory accesses. It will be appreciated, however, that each channel could be limited to a predetermined number of memory uninterrupted memory accesses. State machine 240 could enforce such a limitation using an internal counter identifying the number of accesses made since the last time an access request was loaded from arbitrator 122 (by passing through the start in FIG. 3C or FIG. 3D). If this count exceeded the maximum allowed to the current channel (as identified to state machine 240 on lines 165 ), state machine 240 could proceed from any of steps 318, 338 or 360 (and/or any of steps 312, 332, 354 or 376) to step 392, to write back a substitute request to arbitrator 122, and thus suspend further processing of the request until a later time.

Figure 4A:
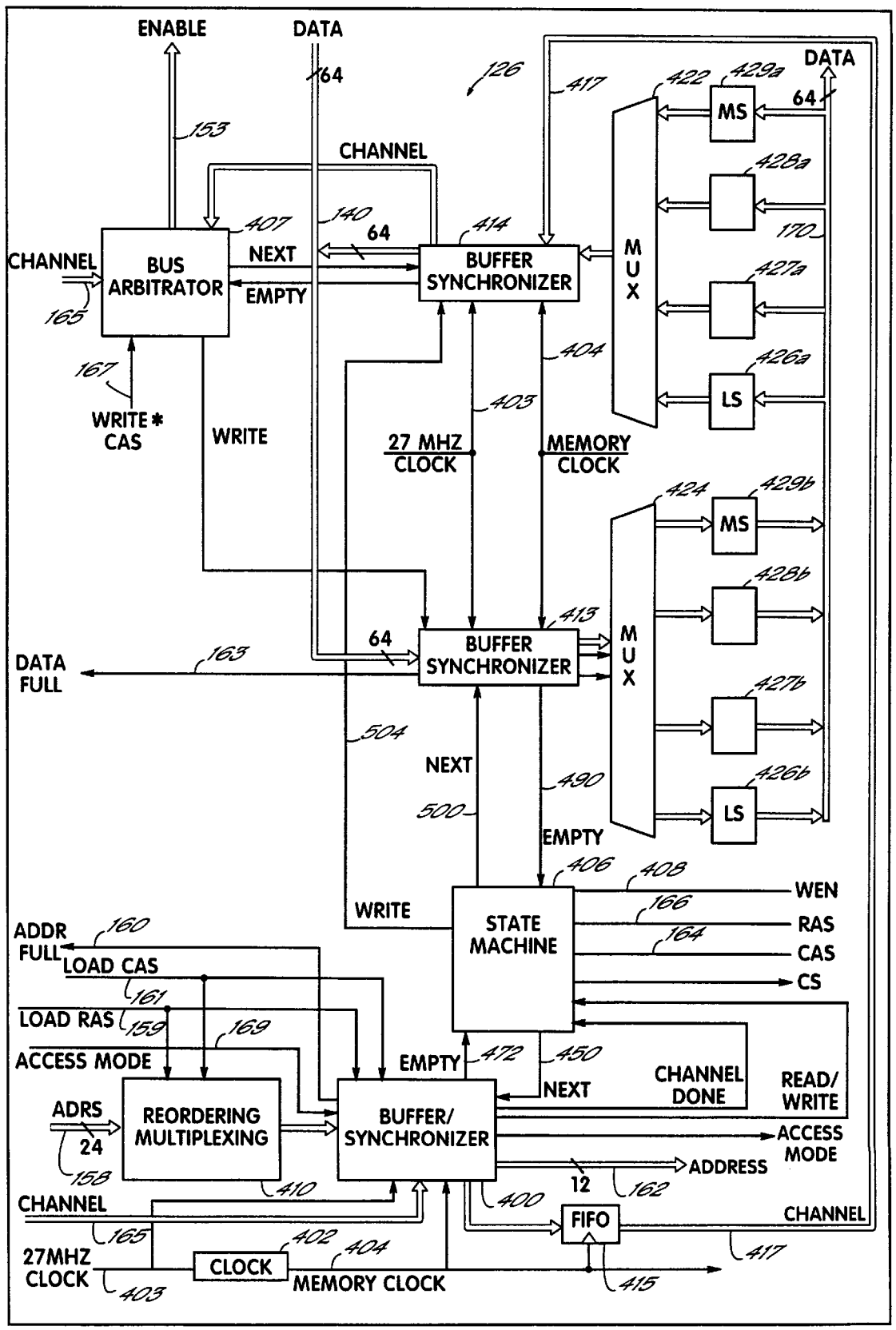
FIG. 4A is a block diagram of the DRAM interface of FIG. 1, configured for buffering of memory requests and data, providing an asynchronous clock for memory accesses, and generating appropriately timed read and write address strobe signals for a particular memory circuit in use.

Referring now to FIG. 4A, details of the operation of DRAM interface 126 can be disclosed. DRAM interface 126 includes a number of functional units providing a DRAM interface which is compatible with various DRAM configurations. Specifically, DRAM interface 126 includes a buffer/synchronizer unit 400 for receiving virtual addresses on bus 158, channel identifiers on lines 165, the LOAD CAS and LOAD RAS signals on lines 159 and 161, and ACCESS MODE signals on lines 169. Buffer/synchronizer 400 buffers and synchronizes addresses, channel identifiers, and control signals, with a memory clock generated by a clock circuit 402. Buffer synchronizer 400 further produces the ADDRESS FULL signal on line 160 for indicating when buffer/synchronizer 400 is full, which halts delivery of additional address signals from address generator 124.

Clock circuit 402 is responsive to a 27 MHZ clock signal on line 403, which is a clock signal used by the remainder of the ASIC 100 and is therefore synchronized with all signals received from the ASIC chip. Clock circuit 402 generates a second clock signal on line 404 which is used by the memory chips which form DRAM memory 120. Because each vendor's memory chips have slightly different timing characteristics, each memory chip may be optimally driven with slightly different clock speeds. To permit near-optimal use of different memory chips, clock circuit 402 generates a memory clock which is asynchronous with the main 27 MHZ clock on line 403 used in the remainder of the ASIC chip 100. The memory clock signal produced by clock circuit 402 on line 404 is delivered to each of the functional blocks inside of DRAM interface 124 and is used by those elements to produce signals synchronized with the memory clock, for delivery to the DRAM circuit 120.

Also included in DRAM interface 126 is a state machine 406 which generates the column address strobe and row address strobe signals on lines 164 and 166 to read or write DRAM memory 120. State machine 406 also produces a write enable signal on line 408 for directing DRAM memory 120 to read or alternatively to write at a specified memory address, in response to control signals produced by buffer/synchronizer 400 and other units.

DRAM interface 126 further includes a reordering/multiplexing circuit 410 used to manipulate the address signal from address generator 124 on bus 158 into a column address or row address for output (via buffer/synchronizer 400) on bus 162 to DRAM memory 120. In the process of outputting the column and row address, circuit 410 performs some amount of reordering of bits in the address in order to simplify the circuitry in circuit 410 as discussed in further detail below.

DRAM interface 126 further includes two additional buffer/synchronizers 413, 414. Buffer/synchronizers 413 and 414 are responsive to control signals on lines 490, 500 and 504 from state machine 406, to buffer data words input on bus 140 for writing to DRAM memory 120 (in buffer/synchronizer 413 ), or to buffer data words output from DRAM memory 120 for delivery to data bus 140 (in buffer/synchronizer 414). Each of buffer/synchronizers 413, 414 contains four 64 bit entries for buffering up to four 64 bit data words incoming to the memory or outgoing from the memory.

The four buffer entries in buffer/synchronizer 414 further include locations for storing a channel number associated with the data being returned through buffer/synchronizer 414. When an address is delivered to memory by buffer/synchronizer 400, the identity of the corresponding channel is delivered to the input of FIFO 415, which is clocked by the memory clock on line 404. After a delay equal to the access delay of the memory 120, FIFO 415 produces the identity of the channel on lines 417. Buffer/synchronizer 414 receives this channel identification from lines 417, and stores it associated with the data received from memory by buffer/synchronizer 414.

Also included in DRAM interface 126 is a multiplexing circuit including a data multiplexor 422 and a data multiplexer 424. Multiplexer 422 receives sixteen bit data words from eight transceivers 426a, 427a, 428a, and 429a and multiplexes these sixteen data bit words from and to buffer/synchronizer circuit 414. Multiplexer 424 receives sixty-four bit data words from buffer/synchronizer circuit 413 and multiplexes these words to transceivers 426b, 427b, 428b, and 429b. The inclusion of this multiplexing circuitry in DRAM interface 126 permits the address controller to interface with memories of different widths, including 16 bit widths, 32 bit widths or 64 bit widths, as discussed below with reference to FIG. 4H.

A final component of DRAM interface 126 is a bus arbitrator 407, which generates the enable signals on bus 153 for instructing particular functional units to use the data bus 140. Arbitrator 407 is responsive to an EMPTY signal from buffer/synchronizer 414, as well as to the WRITE*CAS signal from address generator 124. Bus arbitrator 407 is also responsive to the selected channel signal on lines 165 generated by address generator 124, as well as to the channel signal output by buffer/synchronizer 414. Bus arbitrator 407 produces the enable signals on lines 153 identifying which functional unit has access to bus 140. When data is sequentially read from memory by a functional unit, bus arbitrator 407 delivers a NEXT signal to buffer/synchronizer 414 to cause buffer/synchronizer 414 to deliver data words stored therein to bus 140. When data is being written to memory by a functional unit, bus arbitrator 407 delivers a WRITE signal delivered to buffer/synchronizer 413 to cause buffer/synchronizer 413 to store a data word from data bus 140. Bus arbitrator 407 determines which functional unit is to be provided access to the bus, in accordance with the following criteria. Whenever data is available in buffer/synchronizer 414, as indicated by the absence of an EMPTY signal from buffer/synchronizer 414, bus arbitrator 407 gives immediate access to the functional unit identified by buffer/synchronizer 414, causing that functional unit to read the data from buffer/synchronizer 414. When data is being written to memory (as indicated by the WRITE*CAS signal on line 167), bus arbitrator 407 delivers access to bus 140 to the functional unit being serviced by address generator 124 as identified by the channel signal on lines 165. Since bus 140 may be used for memory reads as well as memory writes, arbitrator 407 may not provide immediate bus access to a functional unit seeking to write to memory, even though that unit is currently being serviced by address generator 124. In such a situation, buffer/synchronizer 413 may become empty and generate an EMPTY signal on line 490 to state machine 406, causing state machine 406 to stall further generation of memory addresses until the bus is made available to the functional unit wishing to write to memory, and data is delivered to buffer/synchronizer 413.

Figure 4B:
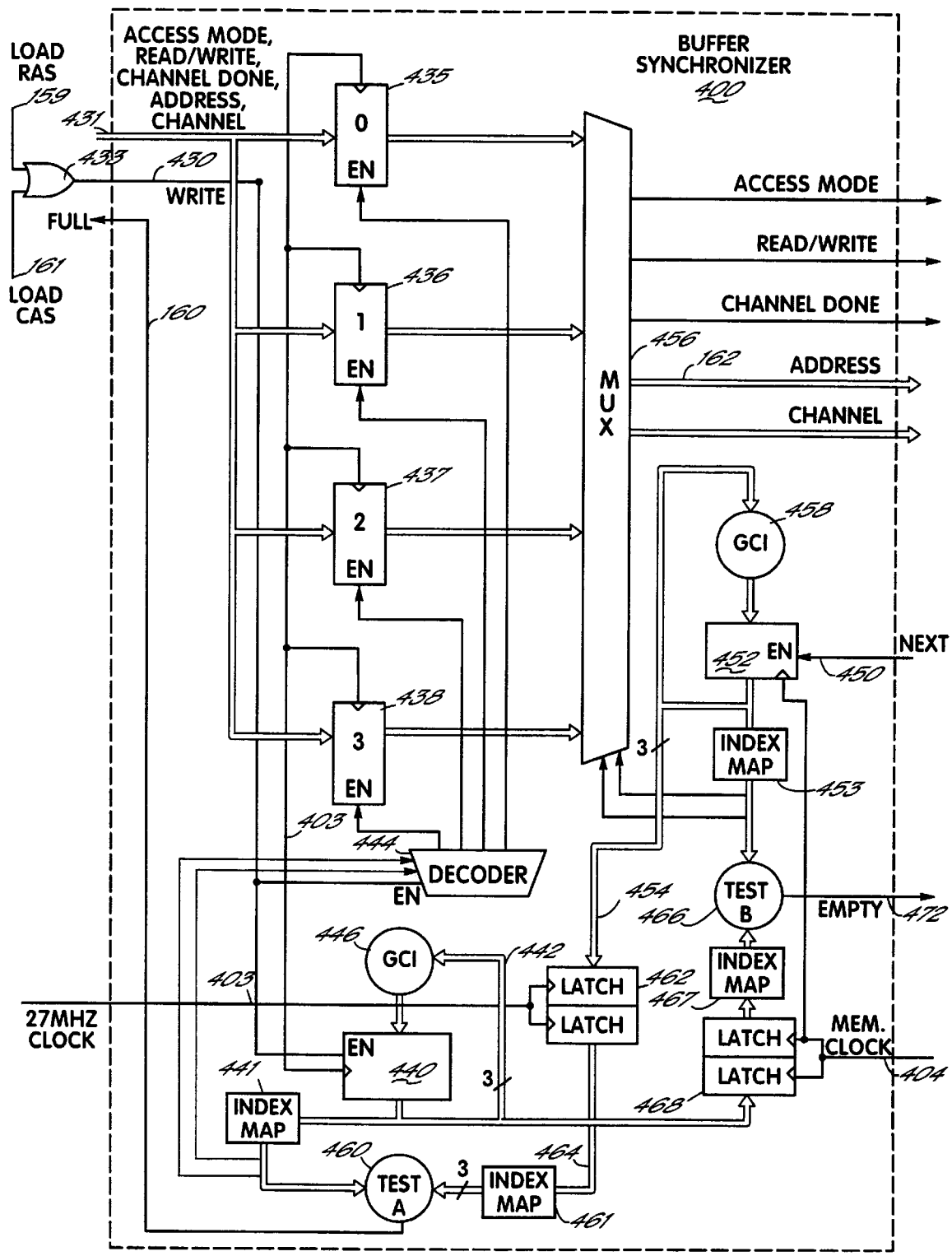
FIG. 4B is a block diagram of the buffer/synchronizer of FIG. 4A used to buffer memory addresses incoming to the DRAM interface of FIG. 1 and deliver these memory addresses in synchrony with the memory clock signal.

Referring now to FIG. 4B, details of buffer synchronizer circuit 400 can be explained. Buffer/synchronizer circuit 400 receives the 27 MHZ clock used by the ASIC 100 on line 403, a write signal on line 430 indicating that a new memory address is being delivered on bus 431 (which is derived from the LOAD RAS and LOAD CAS signals on lines 159 and 161 by an OR gate 433), and a NEXT signal on line 450 indicating that a new address should be delivered from the buffer to bus 162 leading to memory 120. Buffer/synchronizer 400 receives for storage, bus 431 carrying (a.) a 12 bit column or row address generated by address reordering/multiplexing circuit 410, (b.) an identification of the channel for which the column or row address was generated, as identified on lines 165, (c.) a READ/WRITE signal identifying whether the generated address is being read or written (derived from the least significant bit of the column address delivered to DRAM interface 126), (d.) a CHANNEL DONE signal identifying whether the current address is the last address for the current channel (derived from the LOAD CAS signal on line 161), and (e.) the ACCESS MODE signal on line 169.

Buffer/synchronizer circuit 400 produces a FULL signal on line 160 for delivery to address generator 124 for indicating when a there is no space in the buffer, and an EMPTY signal on line 472 for delivery to state machine 406 indicating when the buffer is empty.

Buffer synchronizer 400 has the purpose of buffering row and column address words from address generator 124 (after remapping by reordering/multiplexing circuit 410), and the other above-mentioned control signals on bus 431, and synchronizing the output of the row and column address words and control signals to the memory clock on line 404, which may have a different frequency than and be asynchronous relative to the 27 MHz clock signal on line 403. To perform this function, buffer synchronizer 400 includes a four entry, first in, first out (FIFO) memory, and logic for determining when this memory is full and when this memory is empty, in order to deliver address signals as needed to memory 120 via bus 162. Furthermore, synchronizer 400 includes circuitry for insuring that this FIFO memory does not unintentionally discard data as a result of asynchronous clocks on lines 403, 404.

At the heart of buffer synchronizer circuit 400, are four registers 435,436,437 and 438. These registers are written from bus 431. Register 440 in buffer synchronizer circuit 400 stores a three bit pointer, which identifies the location to which the next incoming address and associated data on bus 431 should be written.

Specifically, the output of register 440 is delivered to a three bit bus 442, which is connected to an index map circuit 441. Index map circuit 441 converts the three-bit signal on bus 442 into a three-bit signal, the two least significant bits of which are delivered to control inputs of a decoder 444. As a result of the two bits delivered from index map circuit 441, if decoder 444 is enabled by a WRITE signal on line 430, one of the four outputs of decoder 444 will enable a corresponding one of the four registers 435, 436, 437 or 438 to store signals from bus 431. Once a register is enabled, the next transition of the memory clock on line 403 will cause the register 435 through 438 to store signals from bus 431. At the same time, the write signal on line 430 enables register 440, upon the next transition of the memory clock on line 403, to store the output of a Gray code increment circuit 446. Gray code increment circuit receives at its input, the three digital signals of bus 442, and generates at its output, a three-bit signal which is incremented by one, in a Gray code format. Thus a WRITE signal on line 430, causes the contents of three bit register 440 to incremented by one, in a Gray code format, and simultaneously loads one of the registers 435 through 438 with signals from bus 431.

Address values are continuously read from registers 435, 436, 437 and 438. In response to a NEXT signal on line 450 from state machine 406, the next register is read through multiplexer 456. The NEXT signal on line 450 is connected to the enable input of a second three bit register 452. The output of register 452 is connected to a three bit data bus 454 and, like the three bit output of register 440, to an index mapping circuit 453. Index mapping circuit 453 produces a three bit output signal, the two least significant bits of which identify a register from which binary address information should be read. Specifically, the two least significant bits output from index mapping circuit 453 are delivered to the control inputs of multiplexor 456. Multiplexor 456 selects in response to these two bits, one of the four outputs of the four registers 435 through 438 storing previously-received addresses. The output of multiplexor 456 includes the stored address, delivered on bus 162 to memory 120, as well as the stored channel, delivered to FIFO 415, and the READ/WRITE, CHANNEL DONE and ACCESS MODE signals, delivered to state machine 406 and memory 120.

Index mapping circuits 441 and 453 produce index values in response to Gray coded values received on busses 442 and 454, respectively. The truth table for the index mapping circuits is:

| Index mapping input (Gray code) | Index mapping output |
|---|---|
| 000 | 000 |
| 001 | 001 |
| 011 | 011 |
| 010 | 010 |
| 110 | 100 |
| 111 | 101 |
| 101 | 111 |
| 100 | 110 |

It will be noted that the left column of this table are sequential binary values in three-bit Gray code. The right column of the table, however, is neither binary-encoded or Gray coded. However, the right column of the table does have the feature that the two less significant bits repeat each four rows. This property of the index mapping circuit outputs is used in determining whether the buffer is full or empty, as discussed in further detail below.

It will also be noted that the first and third bits of the values in the right column are identical to the first and third bits of the values in the left column, however the second bit of the values in the right column is equal to the exclusive OR of the second and third bits of the values in the left column. Accordingly, the index mapping circuits may constitute a single exclusive OR gate generating a new value for the second bit from the exclusive OR of the second and third bits input to the index mapping circuit.

Continuing now in FIG. 4B, the NEXT signal received on line 450, is connected to an enable input of register 452. The NEXT signal enables register 452, so that upon the next transition of the memory clock on line 404, register 452 replaces its current contents with the output of a Gray code incrementing circuit 458. Gray code incrementing circuit 458 is a three bit Gray code incrementing circuit whose input is connected to the three bit bus 454. As a result of this circuitry, in response to the NEXT signal on line 450, the value stored in register 452, and output on bus 454, will be incremented in a Gray code format.

To determine whether buffer synchronizer circuit 400 is full, and unable to store an additional address from bus 431, buffer synchronizer 400 includes a test circuit A 460. Test circuit A 460 receives at one input the three bit output of index mapping circuit 441, which indicate the location to which the next incoming address will be stored. The second input of test circuit A 460 is the three bit output of an index mapping circuit 461, which is identical to index mapping circuits 441 and 453 discussed above. The input of index mapping circuit 461 is connected to a three bit bus connected to the output of a two-stage three bit latch 462. The input of latch 462 is connected to three bit bus 454, so that the output of latch 462 is a delayed version of the three digital signals on bus 454. The output of index mapping circuit 461 is compared to the output of index mapping circuit 441 by test circuit A 460, and test circuit A 460 responds to these two values by producing the FULL signal on line 160, if only if the comparison of the three bit signals delivered to test circuit A 460 indicate that there are no registers available for storing another address word from bus 158. Specifically, test circuit A 460 compares the two least significant bits of the three bit signals output from index mapping circuits 441 and 461 and also compares the most significant bits output from index mapping circuits 441 and 461. If the most significant bits output from index mapping circuits 441 and 461 are different, and the least significant bits output from index mapping circuits 441 and 461 are the same, the registers are full and the FULL signal on line 160 is asserted. If the most significant bits output from index mapping circuits 441 and 461 are the same, or the least significant bits output from index mapping circuits 441 and 461 are different, this indicates that the buffer has space in which to store additional addresses, and test circuit 460 will not assert the FULL signal on line 160.

Similarly, a test circuit B 466 in buffer synchronizer 400 performs a comparison of the three bit signal output from index mapping circuit 453, to a three bit signal output from an index mapping circuit 467 identical to index mapping circuits 441, 453 and 461 discussed above, to determine whether any address data is available in buffer synchronizer 400 for output through bus 162 from multiplexor 456. The input of index mapping circuit 467 is connected to the output of a two-stage latch 468. The input of two-stage latch 468 is connected to three bit bus 442. Test circuit B 466 compares the three bit output signals from index mapping circuits 453 and 467, by separate comparisons of the most significant bits and two less significant bits. If the most significant bits output by index mapping circuits 453 and 467 are identical, and the least significant bits output by index mapping circuits 453 and 467 are also identical, this indicates that there is no new data is available in any of any of registers 435 through 438, and as result, test circuit B 466 asserts the EMPTY signal on line 472. However, if the most significant bits output from index mapping circuits 453 and 467 are not identical, or if the two less significant bits output from index mapping circuits 453 and 467 are not identical, then there is new data available in one of registers 435 through 438, and test circuit B 466 does not assert the EMPTY signal on line 472.

As noted above, the signals on bus 454 are connected to index mapping circuit 461 via a two-stage latch 462, which is clocked by the 27 MHz clock on line 403. Similarly, the signals on bus 442 are connected to index mapping circuit 467 via another two stage latch 468, which is clocked by the memory clock on line 404. The purpose of these latches is to reduce any metastability which may be caused by the asynchronous nature of memory clock signal on line 404 as compared to 27 MHz clock signal on line 403. Specifically, it may occur that the three bit signal on bus 454 is undergoing a transition, at the same time that latch 462 is being clocked by the 27 MHz clock on line 403. If this occurs, the first stage of latch 462 may receive an undefined input and generate a metastable output; however, if this were to occur, the second stage of latch 462 would be likely to convert the metastable output of the first stage of latch 462 into a well defined one or zero output on bus 464 for delivery to index mapping circuit 461. Similarly, if a metastable state is reached in the first stage of latch 468 due to simultaneous signal transitions on bus 442 and memory clock on line 404, this metastable state is likely to be converted to a well defined zero or one value in the second stage of latch 468 upon the next rising edge of the memory clock 404.

For the purpose of mitigating the effects of possible metastability, it is important to note the use of Gray code formatting of the digital signals on the three bit buses 454 and 442. Specifically, the three bit Gray coded signal is incremented by one of Gray code incrementers 458 and 446 in accordance with the following table:

| Value | Bit 2 | Bit 1 | Bit 0 |
|-------|-------|-------|-------|
| 0 | 0 | 0 | 0 |
| 1 | 0 | 0 | 1 |
| 2 | 0 | 1 | 1 |
| 3 | 0 | 1 | 0 |
| 4 | 1 | 1 | 0 |
| 5 | 1 | 1 | 1 |
| 6 | 1 | 0 | 1 |
| 7 | 1 | 0 | 0 |

As can be seen from the foregoing table, one property of Gray coded binary values is that there is only one bit transition between each value and the value next higher and the value next lower. This property of Gray code format digital values is particularly useful in the present application due to the potential metastability discussed above. Specifically, if either of latch 462 or 468 obtains a metastable input due to simultaneous transitions of clock signals and inputs to the latch, and providing that the dual latch circuit 462 or 468 is successful in resolving the metastable output to a stable zero or one value, the metastability will not have an adverse effect upon the operation of buffer synchronizer 400. Specifically, due to the use of Gray coding, only one of the three lines that comprise bus 442 or bus 454 will be transitioning at any one time from a zero to one or a one to zero value, as Gray code incrementers 446 or 458 increment the signals on their input bus 442 or 454 to the next higher Gray-coded value. As a result, only one of the inputs to latch 462 or 468 may be undergoing a transition when the respective latch is clocked. Therefore, only one of the three bits stored in the first stage of latches 462 or 468 might be metastable. If this metastable value is then resolved by the second stage of the respective latch 462 or 468 to a stable zero or one value, this value will representative of either an incremented Gray-coded value, or an unincremented Gray-coded value. In either case, there will be no adverse result. If the result of resolving the metastability generates an output value on bus 464 indicating the unincremented Gray code value on bus 454, this will prevent a new address 158 from being written to one of latches 435 to 438 for only one cycle of the 27 MHZ clock 403. It will not, however, disable the buffer synchronizer 400 in any way, and upon the next clock cycle, the incremented value from bus 454 will be delivered to bus 464, and at that time an address on bus 158 may be written to the location to which previously was prevented from being written. The result of the metastability, therefore is at most a one clock cycle delay when delivery of new address information to buffer synchronizer 400. It will not result in breakdown of buffer synchronizer 400 or unintended overwriting of address information that has not yet been read by buffer synchronizer 400 via bus 162.

Similarly, metastability in latch 468 will not have an adverse impact on the operation of buffer synchronizer 400. It will not result in breakdown in buffer synchronizer 400 or unintended reading of address information that has not yet been written by buffer/synchronizer 400 from bus 431. Specifically, metastability will at worst produce a value on bus 470 which is unincremented as compared to the value on bus 442. If an unincremented value appears on bus 470, the result will be that the EMPTY signal on line 472 will be asserted even though there is a valid address available in one of the registers 435–438 for output. However, this error condition will be resolved upon the next clock signal on line 404, which will cause the incremented Gray code value to be delivered to lines 470, causing test circuit 466 to de-assert the EMPTY signal on line 472. Thus, the effect of metastability in latch 468, assuming the metastability is resolved by the dual stage structure of latch 468, is only a one clock cycle delay of access to address data stored one of registers 435 to 438, rather than a malfunction of buffer synchronizer 400 or reading of invalid data.

Relative immunity to metastability is particular advantage of the use of Gray coding formatting in bus 442 and bus 454, as opposed to the use of a strict binary format or another format in which multiple bit transitions might occur in a single incrementing operation. It is because only one bit transition will occur in each increment of a Gray coded number, that metastability and the resulting indecision between zero and one values, will not have damaging impact on buffer synchronizer 400.

Referring again to FIG. 4A, it has been noted that there are additional buffer/synchronizer circuits 413 and 414 used to buffer and synchronize data outgoing from the ASIC to memory, or incoming from the memory to the ASIC. These buffer/synchronizer circuits have a similar internal structure to that illustrated in FIG. 4B, with the exception that 64 or more bits of data are passed through the buffer. Accordingly, the data busses leading into and out of the buffer/synchronizer circuits are 64 or more bits wide, the multiplexer is 64 or more bits wide. In addition, there are sixteen internal 16-bit registers, for storing four 64-bit words, and the internal counters include three Gray-coded bits, and two additional non-Gray-coded address bits. In buffer/synchronizer 414, these two additional address bits may be used in selecting ones or pairs of the sixteen 16-bit registers in buffer/synchronizer 414 which are to receive individual 16-bit data words from a 16-bit or 32-bit memory via multiplexer 422, as discussed in further detail below. In buffer/synchronizer 413, these two additional address bits may be used in identifying for output to memory, which 16-bit or 32-bit sections of a 64-bit word stored in buffer/synchronizer 413 from data bus 140, are to be output to memory via multiplexer 424, as discussed in further detail below. However, in either case, only the three most significant bits of Gray-coded counters are compared, to determine whether a complete set of four 16-bit registers is full or empty, so that registers are written or read by data bus 140 in groups of four.

Figure 4C:
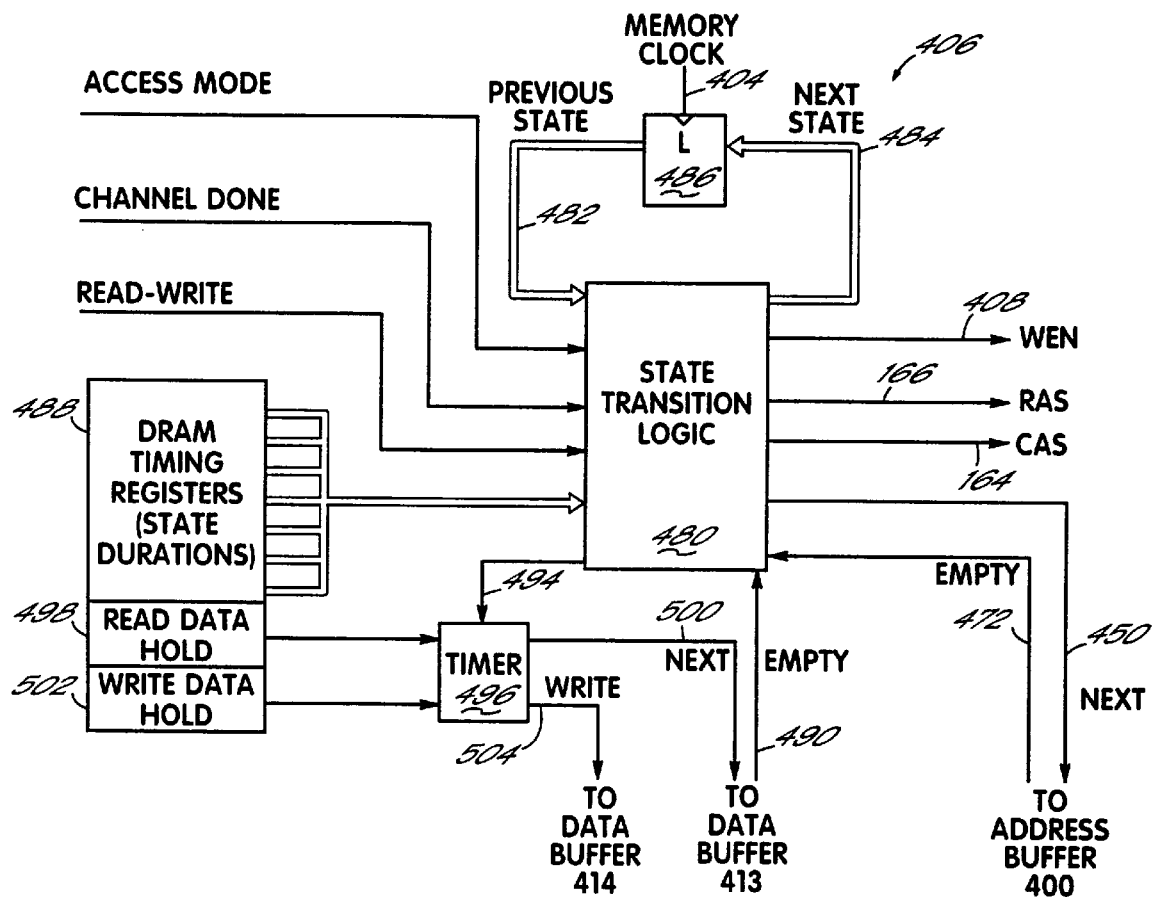
FIG. 4C is a block diagram of the state machine of FIG. 4A, which generates appropriately timed read address and write address strobe signals for controlling a particular memory in use.

Now referring to FIG. 4C, the operation of state machine 406 can be understood in greater detail. The heart of state machine 406 is a block of combinational logic 480 which defines various state transitions and outputs associated with each state. The state transition logic 480 is responsive primarily to a previous state signal on bus 482 indicative of a previous state of the state machine 406. Among the outputs of state transition logic 480 is a next state signal on bus 484. A latch 486 responsive to the memory clock on line 404 delivers the next state signal 484 to the previous state bus 482 upon each memory clock, causing the state transition logic 480 to move from one state to the next appropriate state.

Additional inputs to the state transition logic 480 are used to determine when a state transition is appropriate. Specifically, the READ/WRITE signal from buffer/synchronizer 400, which is derived from the least significant bit of the memory address, is delivered to state transition logic 480 to indicate whether address memory locations are to be read or written by the memory controller. Further, the CHANNEL DONE signal from buffer/synchronizer 400, which is derived from the LOAD RAS and LOAD CAS signals on lines 159 and 161, is delivered to state transition logic 480 to indicate the start of each sequence of memory accesses for a particular channel of the memory. Additionally, a collection of DRAM timing registers 488 is accessible to state transition logic 480. The DRAM timing registers identify the duration of time for which state transition logic 480 should remain in each of its output states as discussed below.

Outputs of state transition logic 480 include the column address strobe signal on line 164, used to deliver a column address to DRAM 120, the row address strobe signal on line 166, used to deliver a row address to DRAM 120, and a write enable signal on line 408, used to identify whether an addressed location is to be read or written.

State transition logic 480 further includes inputs and outputs for interacting with buffer synchronizers 400, 413 and 414 (FIG. 4A). Specifically, state transition logic 480 is responsive to the EMPTY signal on line 472 to determine that there is no address is available in buffer synchronizer 400. Further, state transition logic 480 generates the NEXT signal on line 450, instructing buffer synchronizer 400 to deliver a new address for output to DRAM memory 120. Additional signal inputs and outputs control buffer/synchronizers 413 and 414. Specifically, an EMPTY signal on line 490 from buffer 412 indicates when data is available in buffer/synchronizer 413 for delivery through multiplexing circuit 424 to DRAM 120.

State transition logic 480 also generates command signals on line 494 to control a timer 496 to control the buffer/synchronizers 413 and 414. Specifically, timer 496 responds to a read data hold time stored in a register 498, and a control signal from state transition logic 480 on line 494, to produce a NEXT signal on line 500 instructing buffer/synchronizer 414 to store a data word received from DRAM 120. Also, timer 496 is responsive to a write data hold value in a register 502, and a control signal on line 494 from state transition logic 480, to produce a WRITE signal on line 504 instructing buffer/synchronizer 413 to output new data for delivery to DRAM memory.

Figure 4D:
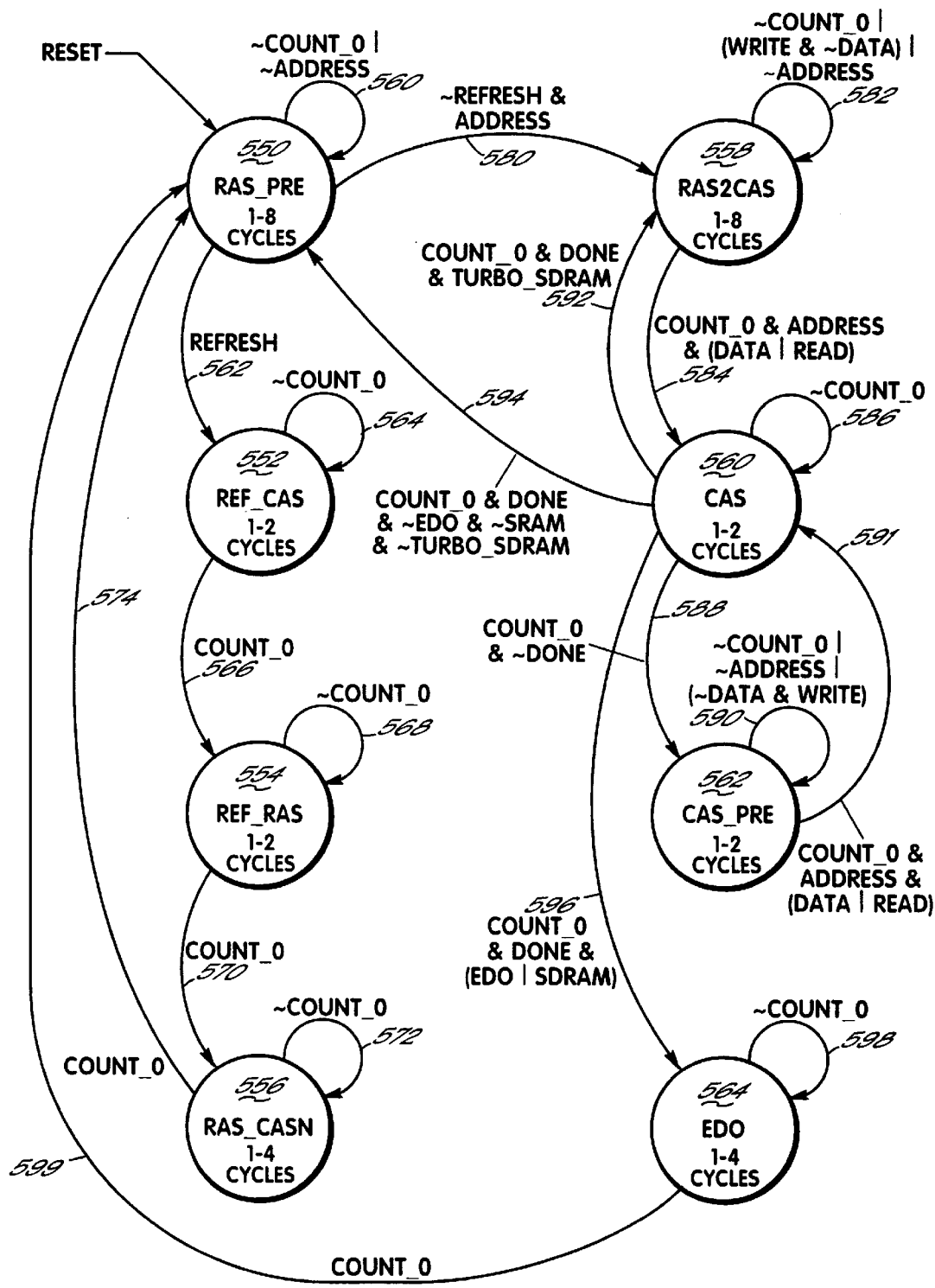
FIG. 4D is a state transition diagram illustrating the states and transitions between states performed by the state machine of FIG. 4C.

The specific operations of state transition logic 480 in response to these inputs and outputs can be better understood by reference to FIG. 4D, which is state transition diagram for state transition logic 480, explaining its interaction in response to inputs, and generation of outputs. As seen in FIG. 4D, state transition logic 480 has eight states through which it might pass. Each state of FIG. 4D is associated with the set of output values for the column address strobe, row address strobe and write enable signals on lines 164, 166 and 408. The output values associated with each of the eight states of FIG. 4D are summarized by the following table (note that different outputs are generated when the memory interface is used in connection with SDRAM memory than with other memory formats):

|     | RAS_PRE | RAS2CAS | CAS | CAS_PRE | EDO   | REF_CAS | REF_RAS | REF_CASN |
|-----|---------|---------|-----|---------|-------|---------|---------|----------|
| RAS | 1       | 0       | 0   | 0       | 0     | 1       | 0       | 0        |
| CAS | 1       | 1       | 0   | 1       | 1     | 0       | 0       | 1        |
| WEN | †       | †       | †   | †       | †     | †       | †       | †        |
|     |         |         |     | SDRAM   |       |         |         |          |
| RAS | 1       | 0       | 1   | 0       | 0     | ††      | 0       | 0        |
| CAS | 1       | 1       | 0   | 1       | 1     | ††      | 0       | 1        |
| WEN | 1       | 1†††    | †   | 1       | 0†††  | ††      | 1       | 1        | where † is a value equal to the read-write input signal;
†† indicates a programmable value, selected to comply with particular memory requirements;
1††† indicates a value which will begin at 1 when the state is entered, then jumps to 0 and back to 1 on succeeding clock cycles (which causes an SDRAM memory to precharge the unused bank); and
0††† indicates a value which begins at 0 when the state is entered, then jumps to 1 and back to 0 on succeeding clock cycles (which causes an SDRAM memory to precharge the unused bank).

The RAS_PRE state 550 is used to precharge the memory grid of the semiconductor chips which form the DRAM memory 120. In the RAS_PRE state both the read address strobe and column address strobe signals are set to a value of one thus instructing the memory array grid to precharge. When state machine 406 is in the RAS_PRE state 550, it will remain in this state until the appropriate number of clock cycles have passed. As discussed above, DRAM timing registers 488 (FIG. 4C) include registers identifying the number of clock cycles for which state machine 406 should remain in each of the eight states described in FIG. 4D. In the case of the RAS_PRE state 550, the DRAM timing register 488 associated the RAS_PRE state 550 will have a value between one and eight, indicating that state machine 406 should remain in RAS_PRE state 550 from one to eight clock cycles after arriving at this state. As indicated by arrow 560, as long as the clock cycle count has not reached zero, state machine 406 will remain in the RAS_PRE state 550.

State machine 406 will not depart from the RAS_PRE state 550 unless a refresh or memory read or write operation has been requested. Accordingly, in the absence of an address state machine 406 will follow arrow 560 and remain in the RAS_PRE state 550 even if the clock cycle count has reached zero. Only if a refresh signal has been received, or an address has received and the count is zero, will state machine 406 depart the RAS_PRE state 550.

If a refresh signal has been received, state machine 406 will move the from RAS_PRE state 550 to the REF_CAS state 552. State machine 406 will remain in the REF_CAS state 552 for one to two clock cycles as determined by the associated DRAM timing register 488. As long as this count of clock cycles does not reach zero, state machine 406 will remain in the REF_CAS state 552 as indicated by arrow 564. Only when the count of clock cycles has reached zero, will state machine 406 proceed to the REF_RAS state as indicated by arrow 566. Again, state machine 406 will remain the REF_RAS state 554 for one to two clock cycles as determined by the DRAM timing register associated with the REF_RAS state 554, as indicated by arrow 568. Only when the count of clock cycles for the REF_RAS state 554 has reached zero will state machine 406 transition from the REF_RAS state to the REF_CASN state 556 as shown by arrow 570. State machine 406 will remain the REF_CASN state 556 for one to four clock cycles as determined by associated DRAM timing register associated with the REF_CASN state 556, as indicated by the arrow 572. Only when the count of clock cycles for the REF_CASN state 556 has reached zero will state machine 406 transition from the REF_CASN state 556 back to the RAS-PRE state 550 as shown by arrow 574.

The REF_CAS, REF_RAS, and REF_CASN states are used in performing a refresh of the DRAM memory 120. In the REF_CAS state 552 the column address strobe signal is brought to a low state signaling the beginning of a refresh cycle. In the REF_RAS state 554 the row address strobe signal is simultaneously brought low initiating the refresh cycle. Thereafter in the REF_CASN state 556 the column address signal is brought high initiating the end of the refresh cycle, and after the REF_CASN state 556, the state machine 406 returns to the RAS_PRE state 550 to precharge the array for a subsequent refresh or memory access.

From the RAS_PRE state 550, state machine 406 will transition to the RAS2CAS state 558 only in the absence of a refresh signal and when an address is available as indicated by the EMPTY signal on line 472, as identified by arrow 580. State machine 406 will remain in the RAS2CAS state 558 for one to eight clock cycles as determined by the associated DRAM timing register 488. As long the count of clock cycles has not been reduced to zero, state machine 406 will remain in the RAS2CAS state 558 as indicated by arrow 582. Furthermore, state machine 406 will remain in the RAS2CAS state 558 as long as the address buffer is empty as indicated by an EMPTY signal on line 472 or, when performing a memory write, as long as state machine 406 has not received a DATA READY signal on line 490. Thus, state machine 406 will await an address (and data if necessary) as indicated by arrow 582 before proceeding from the RAS2CAS state 558. As can be seen in the foregoing table, in the RAS2CAS state 558, the row address signal is brought to a low value, thus delivering a low address to DRAM memory 120. Upon delivery of a column address signal to DRAM memory 120, memory 120 will write data delivered to it or will output data from the addressed memory location. Accordingly, it is necessary to wait for the availability of data to be written to the memory or to wait for the availability of a column address before proceeding from the RAS2CAS state 558.

As seen at arrow 584, state machine 406 will proceed from the RAS2CAS state 558 to the CAS state 560 when the various conditions described in the previous paragraph has been met. Specifically, when the clock count has reached zero, and an address is available, and data is available or state machine 406 reading data from the memory as opposed to writing data to the memory, state machine 406 will transfer from RAS2CAS state 558 to the CAS state 560. In the CAS state 560 the column address strobe output is set to a zero value, thus causing the column address to be read by DRAM memory 120, so that data is read or written from DRAM memory 120. (In 32-bit mode, the column address strobe output will be set to zero value twice, causing two column addresses to be delivered to the memory, as noted above.)

State machine 406 will remain in CAS state 560 for one or two clock cycles depending upon the value stored in the associated entry in the DRAM timing registers 488. As long as the clock cycle count has not reached zero, state machine 406 will remain in the CAS state as indicated by arrow 586. However, if the count has reached zero, state machine 406 may perform several different transitions, depending upon various conditions.

For example, if additional memory locations in the same row (page) of DRAM memory 120 are being accessed in sequence as a result of a block access being performed by address generator 124, state machine 406 will transition to a CAS_PRE state than back to the CAS state, in order to deliver a new column address for reading or writing of DRAM memory 120. Specifically, once the clock cycle count reaches zero in the CAS state 560, if the CHANNEL DONE signal is not asserted, this indicates that further addresses in the same row (page) for the same channel are forthcoming. Accordingly, state machine 406 will transition from the CAS state 560 to the CAS_PRE state 562, as indicated by arrow 588. In the CAS_PRE state 562, the column address strobe signal is returned to a one value, thus precharging the DRAM memory array to read or write a subsequent address in the same row (page). State machine 406 will remain in the CAS_PRE state 562 for one to two clock cycles as determined by the associated timing register 488, as indicated by arrow 590. State machine 406 will also remain in the CAS_PRE state 562 as long as a new column address is unavailable or new data is unavailable when state machine 406 is writing data to DRAM memory 120. Only when the clock cycle clock has reached zero and an address is available and either data is available or state machine 406 is reading data from memory 120, state machine 406 will transition from the CAS_PRE state 562 back to the CAS state 560, thus delivering a new column address to DRAM memory 120 to obtain additional data or write additional data to or from DRAM memory 120. So long as subsequent addresses are being delivered in the same row (page), state machine 406 will remain in this cycle between the CAS state 560 and the CAS_PRE state 562, reading each of the column locations.

If, however, in the CAS state 560 a CHANNEL DONE signal is asserted, this indicates that the memory controller is done reading the current set of addresses from the current row (page), and DRAM memory 120 should be prepared for reading additional data from potentially new rows (pages). In such a situation, state machine 406 may transition from the CAS state to one of three subsequent states.

Where a SDRAM is used, and SDRAM bank overlap is enabled, and the next address is from the alternate bank, then the turbo SDRAM path may be used. When using the turbo SDRAM path, it is not necessary to return to the precharge state RAS_PRE state 550; instead, as indicated by arrow 592, state machine 406 may return directly to the RAS2CAS state 558, thus reasserting the row address strobe and delivering the new row address to DRAM memory 120.

On the other hand, if a conventional DRAM memory is in use, state machine 406 must transition from the CAS state 560 to the RAS_PRE state 550 as indicated by arrow 594, to begin the process of precharging the arrow for the next row and column address.

A third possibility is that the DRAM memory array is either an SDRAM array or another array which requires that the row address strobe signal remain low while the column address signal goes to a one value in the process of returning to the precharge state. In such a situation, state machine 406 proceeds from the CAS state 560 along arrow 596 to the EDO state 564. In the EDO state 564, the column address strobe signal is raised to a one value, while the row address strobe signal remains at a low value. State machine 406 will remain the in the EDO state 564 for one to four clock cycles as determined by the associated DRAM timing register 488, as indicated by arrow 598. Once the clock cycle count reaches zero, state machine 406 will transition along arrow 599 to the RAS_PRE state 550 to begin precharging for the next row and column address or REFRESH cycle.

Figure 4E:
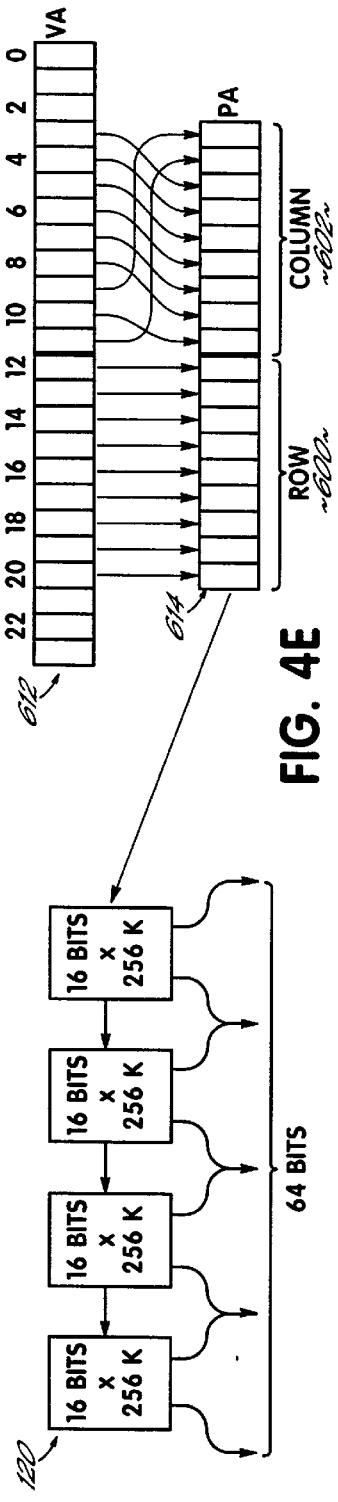
FIGS. 4E, 4F and 4G are illustrations of the mapping between virtual and physical addresses performed by the reordering and multiplexing circuit of FIG. 4A when the memory circuit is 64-, 32- or 16- bits wide.
Figure 4F:
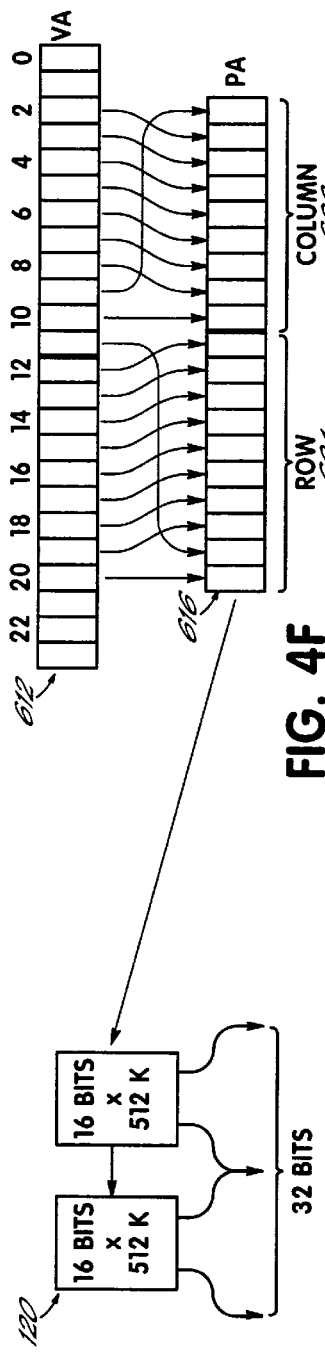
Figure 4G:
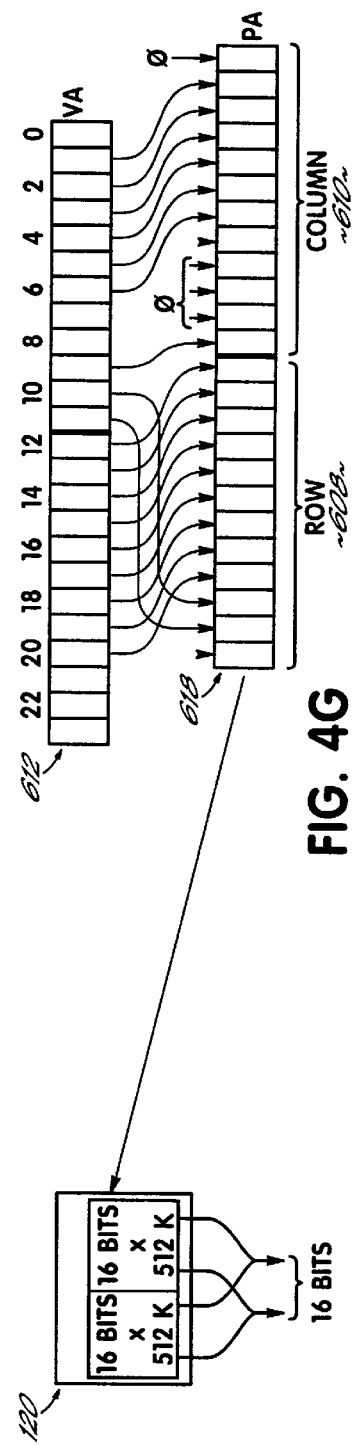

Referring now to FIGS. 4E through 4G, various configurations of DRAM memory 120 can be discussed. Specifically, in the first configuration, shown in FIG. 4E, DRAM memory 120 is formed of banks of four 512 kbyte memories of sixteen bits width. In this configuration, the width of the DRAM memory 120 is 64 bits, i.e. equal to width of data bus 140 of the ASIC 100 (FIG. 1). For this memory configuration, data is accessed with a nine bit row address 600 and a nine bit column address 602.

In a second configuration, shown in FIG. 4F, DRAM memory 120 is formed of banks of two 1 Mbyte memories of sixteen bits width. In this configuration, the width of DRAM memory 120 is 32 bits. Individual locations in the DRAM memory are identified by a ten bit row address 604 and a nine bit column address 606.

In a third configuration, illustrated in FIG. 4G, the DRAM memory 120 is formed of banks of individual SDRAM chips each containing two megabytes of sixteen bit wide memory locations. In this configuration, each location in memory identified by a twelve bit row address 608 and a twelve bit column address 610 (including several zero-valued bits), plus a single bank select bit.

Each of these illustrated configurations, while having different widths and addresses spaces, provides two megabytes of 8-bit bytes of memory.

One of the primary functions of DRAM interface 126 is to permit ASIC 100 to interface with various different memory configurations such as those shown in FIG. 4E, FIG. 4F and FIG. 4G in a manner which is transparent to the functional units of the ASIC 100, to the extent possible. As discussed above, ASIC 100 has a 64 bit addressing mode used in those situations where the physical memory from DRAM memory 120 is 64 bits wide. If functional units in the ASIC 100 are in the 64 bit mode, functional units may not read odd columns of the address space shown in FIG. 3C without also reading the associated even columns of that address space. However, when the ASIC 100 is in 32 bit mode, odd or even columns shown in FIG. 3C may be read as desired by functional units. Accordingly, DRAM interface 126 also operates in a 64 or 32 bit mode. In the 64 bit mode, 64 bits are retrieved in one memory access cycle and delivered to data bus 140, whereas in 32 bit mode, one memory access cycle may be used to store or retrieve 32 bits of data from a 32-bit wide memory, or two memory access cycles may be used to store or retrieve 32 bits of data from a 16-bit wide memory.

Figure 4H:
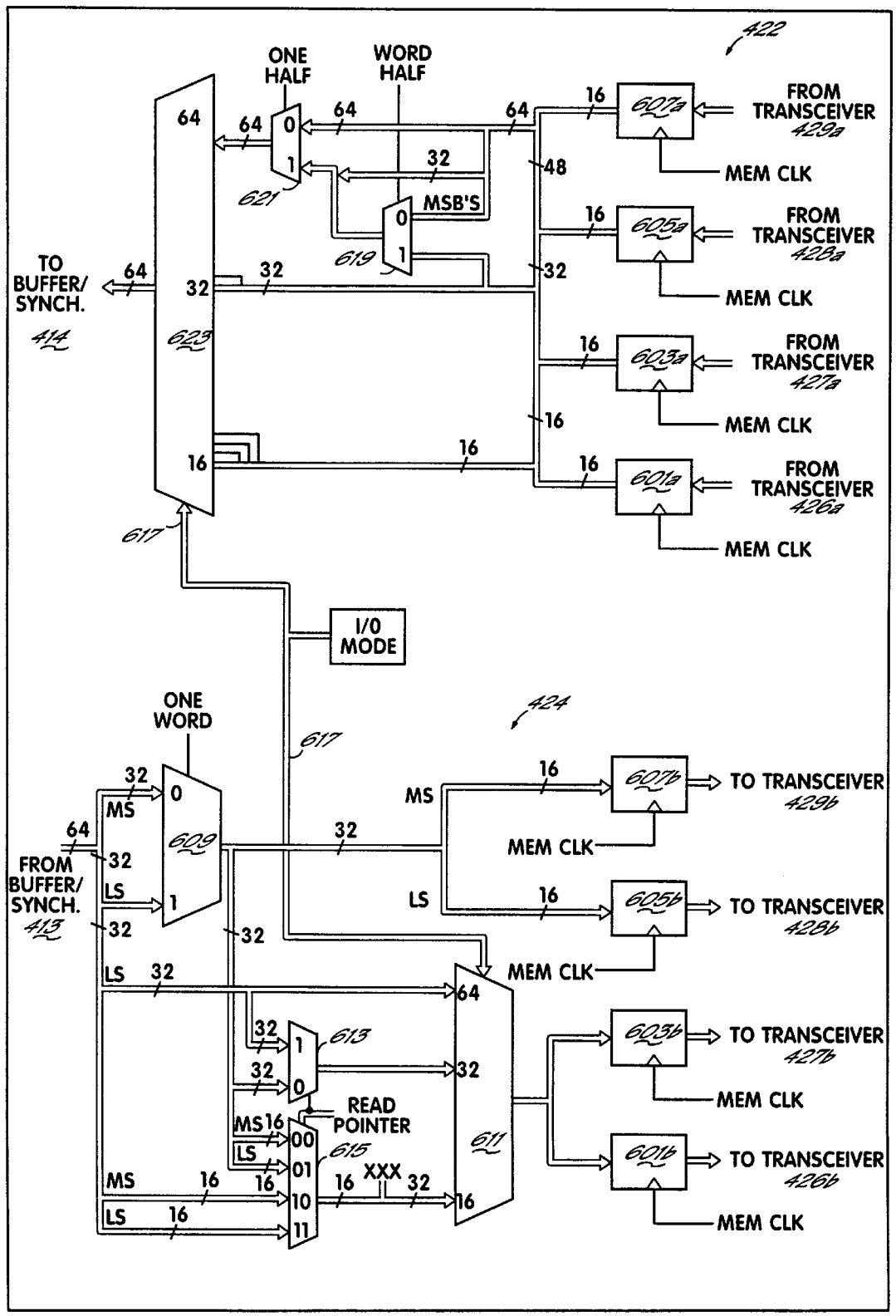
FIG. 4H is a block diagram of the of the multiplexing circuits of FIG. 4A for delivering 64-bit wide data from the internal data bus of the ASIC, to 64-, 32- or 16-bit wide memory locations in the external memory, and vice-versa.
Figure 41:
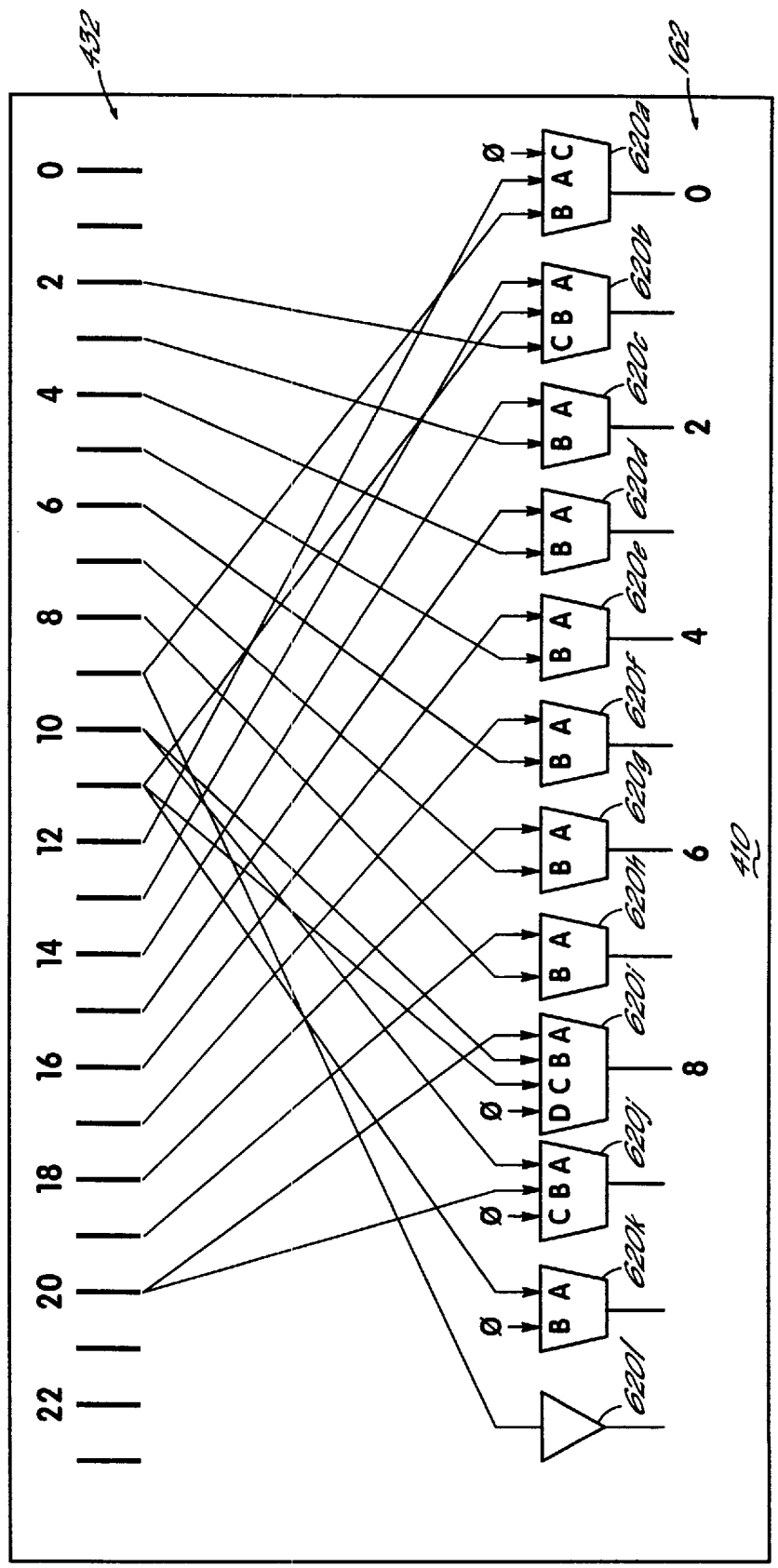

Referring now to FIG. 4H, the multiplexing circuitry used to perform 64, 32 or 16 bit access to or from DRAM memory 120 can be discussed in more detail. As discussed above in connection with FIG. 4A, the DRAM interface circuit 126 includes four transceivers 426*a*, 427*a*, 428*a* and 429*a* coupled to the 64-bit data bus 170 for delivering data from bus 170 to multiplexing circuit 422. These four transceivers are connected to four latches 601*a*, 603*a*, 605*a* and 607*a*, which respectively interface multiplexing circuit 422 to the transceivers. Furthermore, DRAM interface circuit 126 includes four transceivers 426*b*, 427*b*, 428*b* and 429*b* coupled to the 64-bit data bus 170 for delivering data from multiplexing circuit 424 to bus 170. These four transceivers are connected to four latches 601*b*, 603*b*, 605*b* and 607*b*, which respectively interface multiplexing circuit 424 to the transceivers.

Multiplexing circuit 422 includes a number of multiplexers, and input registers 601*a*, 603*a*, 605*a* and 607*a* for latching incoming data from the DRAM memory 120. The multiplexers include a 32-bit, two-input multiplexer 619, a 64-bit, two-input multiplexer 621, and a 64-bit, three-input multiplexer 623. The first input of multiplexer 619 is connected to the 32 less significant bits delivered from memory via registers 601*a* and 603*a*. The second input of multiplexer 619 is connected to the 32 more significant bits delivered from memory via registers 605*a* and 607*a*. The 32 less significant bits of the first input of multiplexer 621 are obtained from the output of multiplexer 619. The 32 more significant bits of the first input of multiplexer 621 are obtained from the 32 more significant bits delivered from memory via registers 605*a* and 607*a*. The second input of multiplexer 621 is connected to the 64-bit input received from memory via registers 601*a*, 603*a*, 605*a* and 607*a*. The first input of multiplexer 623 is a 64-bit signal created from the sixteen least significant bits received from memory, via register 601*a*, replicated four times. The second input of multiplexer 623 is a 64-bit signal created from the thirty-two least significant bits received from memory, via registers 601*a* and 603*a*, replicated twice. The third input of multiplexer 623 is connected to the output of multiplexer 621.

As discussed above in connection with FIGS. 4E, 4F and 4G, the multiplexers forming circuit 422 have three different input/output modes, to deliver 64-bit wide data received from memory, in an appropriate format for output to the functional units of the ASIC through buffer synchronizer 414. The particular input/output mode is identified by an I/O MODE signal delivered to multiplexing circuit 422 on lines 617.

In a 64-bit mode, the 64 bits delivered from memory via latches 601*a*, 603*a*, 605*a* and 607*a*, are delivered simultaneously and in parallel to buffer/synchronizer 414 for output to the functional units of the ASIC. In this mode, multiplexer 621 delivers the 64 bits from the four latches to multiplexer 623, and multiplexer 623 delivers this data to buffer/synchronizer 414.

In a 32-bit mode, data from the memory is delivered in 32-bit words, and thus is delivered in 32-bit words to buffer/synchronizer 414. Specifically, multiplexer 623 delivers the 64-bit signal at its second input, which has the 32-bit signal from latches 601*a* and 603*a* repeated twice, to buffer/synchronizer 414. Buffer/synchronizer 414 uses its internal addressing (discussed above) to load this 32-bit word into a pair of sixteen-bit registers in buffer/synchronizer 414. Since the 32-bit word is delivered to both the 32 less significant and 32 more significant lines delivered to buffer/synchronizer 414, it can be stored in any pair of registers selected by buffer/synchronizer 414.

In a 16-bit mode, the data from the memory is delivered in 16-bit words, and thus is delivered in 16-bit words to buffer/synchronizer 414. Specifically, multiplexer 623 delivers the 64-bit signal at its first input, which has the 16-bit signal from latch 601 a repeated four times, to buffer/synchronizer 414. Buffer/synchronizer 414 uses its internal addressing (discussed above) to load this 16-bit word into a selected sixteen-bit register in buffer/synchronizer 414. Since the 16-bit word is delivered to all four sets of 16 lines delivered to buffer/synchronizer 414, it can be stored in any register selected by buffer/synchronizer 414.

(It will be noted that multiplexers 619 and 621 can be used to deliver the less or more significant 32bits received from memory, to the third input of multiplexer 623. This can be used in connection with a ONE WORD memory read mode, to read a single 32-bit word from a selected memory location of a 64-bit wide physical memory. In a ONE WORD memory access mode, the 32-bit word to be read from memory is identified by a WORD HALF signal, and this 32-bit portion of the 64-bit wide memory output, is delivered to both halves of the ASIC data bus.)

Multiplexing circuit 424 includes a number of multiplexers, including a 32-bit, two-input multiplexer 609, a 32-bit, three-input multiplexer 611, a 32-bit, two-input multiplexer 613, and a 16-bit, four input multiplexer 615. The first input of multiplexer 609 is connected to the 32 less significant bits delivered from buffer/synchronizer 413. The second input is connected to the 32 more significant bits delivered from buffer/synchronizer 413. The 16 more significant bits output from multiplexer 609 are delivered to register 607*b*. The 16 less significant bits output from multiplexer 609 are delivered to register 605*b*. The 16 less significant bits of the first input of multiplexer 611 (used in a 16-bit mode) are connected to the 16-bit output of multiplexer 615, and the 16 more significant bits are hard-wired to minimize logic. The second input of multiplexer 611 (used in a 32-bit mode) is connected to the output of multiplexer 613. The third input of multiplexer 611 (used in a 64-bit mode) is connected to the 32 least significant bits delivered from buffer/synchronizer 413. The first input of multiplexer 613 is also connected to the 32 least significant bits delivered from buffer/synchronizer 413. The second input of multiplexer 613 is connected to the output of multiplexer 609. The first input of multiplexer 615 is connected to the 16 more significant bits output from multiplexer 609. The second input of multiplexer 615 is connected to the 16 less significant bits of the output of multiplexer 609. The third input of multiplexer 615 is connected to the 16 more significant bits of the lower half of the 64-bit input received from buffer/synchronizer 413, and the fourth input of multiplexer 615 is connected to the 16 less significant bits of the lower half of the 64-bit input delivered from buffer/synchronizer 413.

As discussed above in connection with FIGS. 4E, 4F and 4G, the multiplexers forming circuit 424 have three different input/output modes, to deliver 64-bit wide data input from buffer synchronizer 413, into appropriately formatted data in one or more of latches 601*b*, 603*b*, 605*b* and 607*b*. The particular input/output mode is identified by an I/O MODE signal delivered to multiplexing circuit 424 on lines 617.

In a 64-bit mode, the 64 bits delivered from buffer/synchronizer 413 are delivered simultaneously and in parallel to the four latches 601*b*, 603*b*, 605*b* and 607*b*, for output to the data bus. In this mode, multiplexer 609 delivers the 32 more significant bits from the buffer/synchronizer 413 to latches 605*b* and 607*b*. At the same time, multiplexer 611 delivers the 32 less significant bits from buffer/synchronizer 413 to latches 601*b* and 603*b*.

In a 32-bit mode, the 64 bits delivered from buffer/synchronizer 413 are delivered in two 32-bit words through latches 601*b* and 603*b*, for output to the data bus in two memory cycles. In this mode, multiplexer 609 delivers to its output the 32 more significant bits from buffer/synchronizer 413. Multiplexer 613 alternately selects the output of multiplexer 609 or the 32 less significant bits from buffer synchronizer 413, to deliver alternating 32-bit halves of the input from buffer/synchronizer 413 to the second input of multiplexer 617. Multiplexer 611 delivers its second input signal to latches 601*b* and 603*b*.

In a 16-bit mode, the 64 bits delivered from buffer/synchronizer 413 are delivered in four 16-bit words through latch 601*b*, for output to the data bus in four memory cycles. In this mode, multiplexer 609 again delivers to its output the 32 more significant bits from buffer/synchronizer 413. Multiplexer 615 alternately selects the 16-bit words from the output of multiplexer 609, or 16-bit words from the less significant half of the output of buffer synchronizer 413, to deliver four 16-bit fourths of the input from buffer/synchronizer 413, to the third input of multiplexer 611. Multiplexer 611 delivers the 16 less significant bits received at its third input to latch 601*b*.

It will be noted that multiplexer 613 is responsive to a less significant bit of a two bit READ POINTER signal, generated by buffer/synchronizer 413, to deliver alternating 32-bit words through multiplexer 611 to registers 601*b* and 603*b*. As noted above, buffer/synchronizer 413 includes Gray-code incrementing and index generating circuitry similar to that shown in FIG. 4B, with the distinction that two additional, less significant, non Gray-coded signals are included in the addresses generated by buffer/synchronizer 413. The two least significant bits of these Gray-coded signals constitute the READ POINTER signal. Multiplexer 615 is responsive to both bits of the two bit READ POINTER signal generated by state machine 400, to deliver selected 16-bit words through multiplexer 611 to register 601*b*.

(It will be noted that multiplexer 619 permits the less significant 32 bits from buffer synchronizer 413 to be delivered to latches 605*b* and 607*b*. This can be used in connection with a ONE WORD memory access mode, to deliver single 32-bit words to selected memory locations of a 64-bit wide physical memory. In a ONE WORD memory access mode, the 32-bit word to be written to memory is delivered to both the 32 more significant and 32 less significant bits of the data bus 170. Then, only those memory chips to be written with the 32-bit word are enabled.)

Now referring again to FIGS. 4E, 4F and 4G, it will be noted that the virtual address space identified at 612 in each of the Figs., is 24 bits in width, with 12 bit column addresses and 12 bit row addresses, while the physical address space may have column and row addresses of different sizes as a result of the various different memory organizations as discussed above. Accordingly, it is necessary to map the 24 bit virtual address space to different row and column address spaces for various physical memory organizations. This function is performed by reordering a multiplexing circuit 410.

As seen in FIG. 4E through 4G, the mapping between virtual address space bits and physical address space bits is not a direct one-to-one mapping between corresponding locations in the virtual address 612 and the physical address 614, 616 or 618. Rather, as seen in FIG. 4E for example, the ninth and eleventh bits in the virtual address space 612 are used as the two least significant bits of the column address 602 in the physical address space 614 used with 64-bit wide memory. As seen in FIG. 4F, the eleventh bit of the virtual address space 612 is used as the second most significant bit of the row address 604 in the physical address space 616 used with 32 bit wide memory. Further, the ninth, tenth and eleventh bits of the virtual address space 612 are used as the most significant bits of the row address 608 in the physical address space 618 used with 16 bit wide SDRAM memory.

Referring now to FIG. 4I, the rationale behind this bit allocation will be explained. Specifically, the 24 bit virtual address received by DRAM interface 126 on bus 432 must be multiplexed to a twelve bit address bus 162, as row and column addresses to perform memory access. Thus, it is necessary to include multiplexers 620*a* through 620*k* to connect virtual address lines on bus 432 to physical address lines on bus 162. As can be seen in FIG. 4I, multiplexers 620*a* through 620*k* have a relatively simple structure, only one of the multiplexers having four selectable inputs, and only three of the multiplexers having three selectable inputs. The remaining multiplexers have two selectable inputs. This simple multiplexor structure is a result of the allocation of the virtual address space bits to physical address space bits for the various modes shown in FIGS. 4E through 4G. The allocation of virtual address bits to physical address bits shown in those Figs. allows multiplexers 620*c*–620*h* and 620*k* to select from only two of the 24 virtual address lines in bus 432, and be able to generate therefrom the appropriate physical address bits for row addresses or column addresses used in the three different memory modes illustrated in FIGS. 4E through 4G.

For specific illustration, a table provided below indicates the input ("A", "B", "C" or "D") used by multiplexers 620*a* through 620*k* when producing a row or column address in any one of the 64 bit, 32bit or 16 bit memory modes.

|  | 620a | 620b | 620c | 620d | 620 | 620f | 620g | 620h | 620i | 620j | 620k |
|---|---|---|---|---|---|---|---|---|---|---|---|
| FIG. 4E, C addr. | B | B | B | B | B | B | B | B | B | † | † |
| FIG.4E, R addr. | A | A | A | A | A | A | A | A | A | †† | †† |
| FIG.4F, C addr. | B | C | B | B | B | B | B | B | B | † | † |
| FIG.4F, R addr. | A | A | A | A | A | A | A | A | C | B | A |
| FIG.4G, C addr. | C | C | B | B | B | B | B | D | C | B |

|        | 620a | 620b | 620c | 620d | 620 | 620f | 620g | 620h | 620i | 620j | 620k |
|--------|------|------|------|------|-----|------|------|------|------|------|------|
| FIG.4G, R addr. | A | A | A | A | A | A | A | A | A | A | A | where † indicates that the multiplexor output is not used in the column address. Column addresses are at most 9 bits in width. †† indicates that the bit is not used in the row address in 64-bit mode.

By selecting the appropriate inputs to multiplexers 620a–620k, a row and column address can be generated for each of the three memory modes illustrated in the preceding figures, with low complexity.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. For example, principles of the present invention may be applied to memory interfaces used in applications other than digital video signal processing. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method for arbitrating between multiple requests for access to an SDRAM memory comprising a first and a second bank, after first providing access to a first bank of said memory, comprising the steps of:

determining, for each said request for access to said memory, a bank of said memory to which each said request seeks access, selecting other bank requests requesting access to a second bank of said memory, and providing access to said memory in response to an other bank request when there is an other bank request, otherwise providing access to said memory in response to one of said requests.

2. The method of claim 1 adapted for response to a plurality of functional units each of which generates memory request, further comprising the step of:

assigning each functional unit a memory access priority, and wherein said providing access step comprises providing access to said memory in response to an other bank request having highest memory access priority among all other bank requests, otherwise providing access to said memory in response to a request having highest memory access priority.

3. The method of claim 1 further comprising, after said providing access step, the further steps of:

selecting other bank requests requesting access to said first bank of said memory, and providing access to said first bank of said memory in response to an other bank request when there is an other bank request, otherwise providing access to said second bank of memory in response to one of said requests.

4. The method of claim 1 adapted for response to a plurality of functional units each of which generates a memory request, wherein said selecting step further comprises always including any memory access request from a given functional unit in said other bank requests, whereby memory access requests from said given functional unit are provided enhanced priority as compared to requests from other functional units.

5. A memory controller for controlling and arbitrating between multiple requests for access to an SDRAM memory comprising a first and a second bank, comprising interface circuitry providing access to said memory, bank determination circuitry determining, for each said request for access to said memory, a bank of said memory to which each said request seeks access, arbitration circuitry selecting other bank requests requesting access to the second bank of said memory after access has been provided to the first bank of said memory, and causing said interface circuitry to provide access to said memory in response to an other bank request when there is an other bank request, otherwise causing said interface circuitry to provide access to said memory in response to one of said requests.

6. The memory controller of claim 5 adapted for response to a plurality of functional units each of which generates memory request, further comprising:

priority circuitry assigning each functional unit a memory access priority, and wherein said arbitration circuitry causes said interface circuitry to provide access to said memory in response to an other bank request having highest memory access priority among all other bank requests, and otherwise causes said interface circuitry to provide access to said memory in response to a request having highest memory access priority.

7. The memory controller of claim 5 wherein, after causing access to be provided to said second bank, said arbitration circuitry selects other bank requests requesting access to said first bank of said memory, and causes said interface circuitry to provide access to said first bank of said memory in response to an other bank request when there is an other bank request, and otherwise causes said interface circuitry to provide access to said second bank of memory in response to one of said requests.

8. The memory controller of claim 5 adapted for response to a plurality of functional units each of which generates a memory request, wherein said arbitration circuitry always includes any memory access request from a given functional unit in said other bank requests, whereby memory access requests from said given functional unit are provided enhanced priority as compared to requests from other functional units.

* * * * *